US011419245B2

(12) United States Patent
Thornton et al.

(10) Patent No.: US 11,419,245 B2
(45) Date of Patent: Aug. 16, 2022

(54) DATA CENTRE

(71) Applicant: Bripco (UK) Limited, Cheltenham (GB)

(72) Inventors: William Thornton, Cheltenham (GB); Aaron Favill, Leamington Spa (GB)

(73) Assignee: Bripco (UK) Limited, Cheltenham (GB)

( * ) Notice: Subject to any disclaimer, the term of this patent is extended or adjusted under 35 U.S.C. 154(b) by 0 days.

(21) Appl. No.: 17/273,946

(22) PCT Filed: Sep. 10, 2019

(86) PCT No.: PCT/GB2019/052516
§ 371 (c)(1),
(2) Date: Mar. 5, 2021

(87) PCT Pub. No.: WO2020/053569
PCT Pub. Date: Mar. 19, 2020

(65) Prior Publication Data
US 2021/0345526 A1 Nov. 4, 2021

(30) Foreign Application Priority Data
Sep. 13, 2018 (GB) ..................................... 1814906

(51) Int. Cl.
*H05K 7/20* (2006.01)
(52) U.S. Cl.
CPC ..... *H05K 7/20745* (2013.01); *H05K 7/20145* (2013.01); *H05K 7/20836* (2013.01)
(58) Field of Classification Search
CPC ............. H05K 7/20745; H05K 7/1497; H05K 7/20736; H05K 7/20; H05K 7/1488; H05K 7/20136; H05K 7/20554; H05K 7/20754; H05K 7/20827; H05K 7/20781; H05K 7/20009; G06F 1/20; G06F 1/206; G06F 1/16; G06F 1/181; G06F 2200/201
USPC .... 361/679.46, 691, 679.49, 679.47, 679.02, 361/679.48, 688, 690, 692, 701, 679.5; 165/47, 104.33, 222, 247, 80.2, 80.3; 62/259.2; 454/184
See application file for complete search history.

(56) References Cited

U.S. PATENT DOCUMENTS 9,717,165 B2 * 7/2017 Rogers ............... H05K 7/20754
2013/0111937 A1 5/2013 Hendrix et al.
(Continued)

*Primary Examiner* — Mandeep S Buttar
(74) *Attorney, Agent, or Firm* — Carlos A. Fisher; Stout, Uxa & Buyan, LLP

(57) ABSTRACT

A data centre, a method of cooling electrical equipment in a data centre, and a services module for a data centre, are disclosed. The data centre is for accommodating a plurality of racks of IT equipment and comprises: a) a plurality of hot aisles interleaved with a plurality of cold aisles separated by IT equipment rack storage areas; b) an air handling unit configured to supply cooling air to the cold aisles; c) a services area for accommodating at least one UPS switchboard for directing electrical power to a plurality of IT equipment racks, the services area comprising hot and cold zones, a hot zone being separated from a cold zone by at least one of (i) a UPS switchboard storage area and (ii) a partition; wherein, in use, cooling air is supplied to the UPS switchboard storage area from the air handling unit via the cold zone of the services area.

27 Claims, 10 Drawing Sheets

(56) References Cited

U.S. PATENT DOCUMENTS

2016/0302324 A1 10/2016 Rogers
2017/0042067 A1* 2/2017 Parizeau .............. H05K 7/2079

* cited by examiner

DATA CENTRE

FIELD OF THE INVENTION

The present invention concerns data centres and a method of cooling electrical equipment in a data centre. More particularly, this invention concerns data centre buildings having a services area for accommodating uninterruptible power supply (UPS) equipment, and methods of cooling said UPS equipment.

BACKGROUND OF THE INVENTION

A data centre is a late 20th Century development that has grown as a response to the increasing demand for computer processing capability and a recognition of the importance of IT in the place of every business and organisation today. With the ever-increasing demand for computing capacity in recent years, many large organisations have invested in data centres comprising many networked computer servers known as blades installed in racks enabling controlled and modular expansion of capacity. The racks also typically house telecommunications equipment such as routers to handle data flow between the computer servers and data flow between the data centre and the outside world. While such facilities were once the preserve of large, multinational organisations, more recently Data Centre providers have entered the marketplace offering third parties co-location facilities. For example, some large Data Centre providers construct and equip warehouse-sized data centres and sell space in them, such as on a rack-by-rack or hall-by-hall basis. Such providers allow third party organisations to benefit from the advantages of large, specially constructed data centres without having to take on the burden of overseeing construction and maintenance themselves.

Data centre facilities can require a floor space ranging from a few hundred square feet to a million square feet. The most prevalent size for a small data centre is five to ten thousand square feet with fifty to a hundred thousand square feet being the most common floor area requirement for a large data centre.

Data centres will typically have the ability to deliver applications spread across an organisation and/or supply chain and/or customers in differing geographical locations. For many industries, the modern data centre is a mission-critical facility, failure of which (even if only for a short time) could result in serious or even irreparable harm to the organisation. For that reason, modern data centres are designed to be resilient, and typically include dedicated mechanical and electrical (M&E) plant to deliver power, cooling and fire suppression with built-in redundancy with the aim of providing near continuous operation. In particular, modern data centres typically include redundant or backup power supplies, including for example on-site generators. It will be appreciated that computer servers are typically unable to tolerate even a momentary loss in power, and so modern data centres typically include some form of uninterruptible power supply (UPS) system to bridge the gap between the main power source (e.g. an external electric power transmission network, such as the 'national grid' in the UK) going offline and the backup power source (e.g. on-site generators) coming online. For example, it may take up to 5 minutes for on-site generators to start-up and provide adequate electrical power for the data centre. Various different UPS systems are used in data centres around the world, including static systems (e.g. battery powered) and mechanical systems (e.g. flywheel powered). A common feature of most static UPS systems is the use of a UPS switchboard for controlling the UPS system and distributing power into and out of the system. In a battery system, a function of the UPS switchboard is to convert between direct current (DC, as supplied from/to the batteries) and alternating current (AC, as supplied to electrical equipment in the data centre). This current conversion generates a significant amount of heat, and so it is often necessary to actively cool the UPS switchboard to maintain reliable operation. In many data centres, the UPS system is considered to be a critical component that should be reliably and constantly kept in a state readiness. Thus, providing adequate cooling for the UPS system while also maintaining efficient operation of the data centre is important.

In a modern, large-scale data centre, it is not just the power supply to the IT equipment that is critical to continuous operation of the data centre. The high density of IT equipment often present in a modern data centre typically requires continuous active cooling. If the cooling system should fail, it is often the case that the IT equipment would rapidly overheat, which could lead to its damage or even failure. Accordingly, the cooling systems of modern data centres are often also connected to UPS equipment. It will be appreciated that the power demands of the cooling system are not necessarily the same as the power demands of the IT equipment, and so in some data centres, the cooling system is provided with its own, dedicated, UPS system.

Often, to make efficient use of space and to simplify installation and maintenance, UPS equipment is concentrated in one or more designated areas of the data centre. One such approach is to provide a one or more dedicated services areas/services rooms in the data centre for housing UPS equipment. Often, other service equipment, such as main power supply switchboards, is co-located in such dedicated services areas. It will be appreciated that since both the main power supply switchboards and the UPS switchboards are usually connected to the same electrical circuits (i.e. the circuits supplying power to the IT equipment in the data centre), it is often convenient to house them in the same area of the data centre.

In order to provide a resilient data centre facility, critical components of the data centre are often duplicated to provide redundancy. Thus, failure of the entire data centre can be avoided in the event of failure of one critical component. For this reason, IT equipment and other essential data centre components (such as the air cooling system) are often provided with a dual power supply, such as an 'A' circuit and a 'B' circuit. Typically, both the 'A' and 'B' circuits are kept in constant operation, so that blocks of IT equipment, or individual items of IT equipment, can immediately switch to the 'B' circuit in the event of power loss in the 'A' circuit. It will be appreciated that to provide such a level of redundancy, the 'A' and 'B' circuits are usually controlled by independent electrical switchboards, and are connected to independent UPS systems. Thus, a modern data centre may include 'A' and 'B' IT equipment circuits, 'A' and 'B' mechanical equipment (including cooling equipment) circuits, 'A' and 'B' IT equipment electrical switchboards, 'A' and 'B' IT equipment UPS systems, 'A' and 'B' mechanical equipment electrical switchboards, and 'A' and 'B' mechanical equipment UPS systems. If the backup power supply is provided by on-site generators, there may be separate 'A' and 'B' generators, and associated generator control switchboards.

Various standards exist for categorising the resilience level of modern data centres. One measure of data centre resilience is defined by the Uptime Institute's 'Tier Standard' which sets out the minimum requirements for a data centre to be given a Tier Level of between I and IV. Those minimum requirements are:

| Tier level | Requirements |
|---|---|
| I | Single non-redundant distribution path serving the critical loads<br>Non-redundant critical capacity components |
| II | Meets all Tier I requirements, in addition to:<br>Redundant critical capacity components<br>Critical capacity components must be able to be isolated and removed from service while still providing N capacity to the critical loads. |
| III | Meets all Tier II requirements in addition to:<br>Multiple independent distinct distribution paths serving the IT equipment critical loads<br>All IT equipment must be dual-powered provided with two redundant, distinct UPS feeders. Single-corded IT devices must use a Point of Use Transfer Switch to allow the device to receive power from and select between the two UPS feeders.<br>Each and every critical capacity component, distribution path and component of any critical system must be able to be fully compatible with the topology of a site's architecture isolated for planned events (replacement, maintenance, or upgrade) while still providing N capacity to the critical loads.<br>Onsite energy production systems (such as engine generator systems) must not have runtime limitations at the site conditions and design load. |
| IV | Meets all Tier III requirements in addition to:<br>Multiple independent distinct and active distribution paths serving the critical loads<br>Compartmentalization of critical capacity components and distribution paths<br>Critical systems must be able to autonomously provide N capacity to the critical loads after any single fault or failure<br>Continuous Cooling is required for IT and UPS systems. |

In addition to recognising the criticality of reliable central computing facilities, the IT industry has also long recognised the need for energy efficient operations to control cost effectiveness. One measure of the efficiency of data centre operation is Power Usage Effectiveness (PUE), which is the ratio between the energy used by the IT equipment itself and that used by all other equipment (such as the cooling system). PUE is expressed as the total facility energy consumption divided by the IT equipment energy consumption. In PUE terms, the closer to a PUE value of 1, the more efficient the data centre. The industry has also recognised the need to provide efficient and cost-effective methods for constructing data centres. Examples of modern approaches to data centre construction and operation are described in the following International (PCT) Patent Application publications: WO2010/139919, WO2011/148175, WO2010/139921, WO2013/021182, WO2016/193152, WO2016/207323, and WO2017/129448.

Recent developments in data centre operation have focused on improving the efficiency of cooling systems responsible for maintaining the data centre IT equipment within its operational temperature envelope. Many data centres use an air cooling system in which cooling air is supplied to, and contacted with, individual items of IT equipment, thereby generating warm air. The warm air can then be sent back to the air cooling equipment and/or exhausted from the building. It has been found that segregating the IT area of the data centre into hot and cold aisles improves cooling efficiency. Early data centre designs made use of 'CRAC' (Computer Room Air Conditioning) units that provided IT equipment with air chilled only using mechanical cooling devices in which a refrigerant is circulated through a system of condensing and evaporating coils by a pump. Modern data centres often make use of the cooling capacity of ambient air from outside the data centre (so called 'free air cooling'). One approach to using such ambient air is to use the ambient air directly, i.e. by sending ambient air to the IT equipment, known as 'direct air cooling.' Another approach is to use the ambient air indirectly, e.g. by cooling air inside the data centre with the ambient air using a heat exchanger, known as 'indirect air cooling.' While there has been considerable focus on improving the efficiency of IT equipment cooling, the cooling of other mechanical and electrical equipment in the data centre has received less attention. Often, such ancillary mechanical and electrical equipment is kept cool by providing dedicated cooling equipment for the services area. In some cases, this dedicated cooling is provided in the form of stand-alone direct air or mechanical air conditioning units that keep the whole environment of the services area at a constant acceptable temperature. Dedicated cooling equipment can be relatively energy-efficient, especially direct air cooling equipment. Such a system is shown in FIG. 1. FIG. 1 shows a data centre 1100 comprising an IT area 1101 accommodating a plurality of racks of IT equipment, a services area 1102 accommodating UPS equipment, an air handling system 1103*a* for supplying cool air to the IT area 1101, and a separate air handling system 1103*b* for supplying cooling air to the services area 1102. In use, the air handling unit 1103*a* supplies a cooling air stream 1107 to IT equipment in the IT area 1101. Air used to cool the IT equipment exits the IT area 1101 as warm air, which can be returned to the air handling unit 1103*a* as a warm air stream 1108, or exhausted out of the data centre 1100 as an exhaust stream 1109. Thus, the air handling unit 1103*a* may be supplied with the warm air stream 1108 from the IT area 1101, or with an ambient air stream 1110 from outside the data centre 1100. In use, the air handling unit 1103*b* receives an ambient air stream 1112 from outside the data centre 1100, and supplies a cooling air stream 1113 to the services area 1102. Air used to cool equipment in the services area 1102 is exhausted out of the data centre 1100 as an exhaust air stream 1114.

An especially active area in data centre design has been in the development of modular data centre systems, where the data centre is componentised and constructed from kits of parts. In some designs, the data centre is constructed from a plurality of 'volumetric' modules (e.g. structural sections of the data centre that are transported to the data centre site from a remote manufacturing facility and then connected together on-site to form the data centre). A disadvantage with such an approach is that it can result in transporting large boxes containing substantial amounts of free space. Other modular construction methods utilise flat-packed kits of parts that can be transported efficiently and also assembled rapidly on site. It is often the case that the data centre building/structure is sourced separately to the IT equipment, not least because such an approach allows the data centre operator to provide itself with plenty of capacity without committing to the purchase of large quantities of expensive IT equipment. That approach is especially popular in co-location data centre projects where the data centre operator may only provide space for customers to install their own IT equipment. Such flat-pack approaches may not, however, be the most desirable solution for all parts of the data centre.

There remains a need for improved designs of data centre services areas to improve construction and operational efficiency. Furthermore, there remains a need for such improved designs that can be utilised in modern, Tier II, Tier III and/or Tier IV compliant data centres.

SUMMARY OF THE INVENTION

The present invention provides, according to a first aspect, a data centre comprising one or more rack storage areas for accommodating a plurality of racks of IT equipment, an air handling unit for supplying cooling air, and a services area for accommodating other equipment for use during operation of the data centre, wherein the air handling unit is configured to supply cooling air both to the rack storage areas and to the services area. The data centre may have a layout such that there are a plurality of hot aisles interleaved with a plurality of cold aisles, wherein each hot aisle is separated from an adjacent cold aisle by a rack storage area. The air handling unit may be configured to supply cooling air to the rack storage areas via such cold aisles. The services area, typically separate from and spaced apart from the rack storage areas, may be configured to accommodate at least one uninterruptible power supply (UPS) switchboard for directing electrical power to a plurality of racks of IT equipment. When installed in the services area, the UPS switchboard may, for example, be configured to direct electrical power to IT equipment accommodated in the rack storage areas adjacent cold aisles that receive cooling air from an air handling unit different to that which supplies cooling air to the services area. Such an arrangement could be used, for example, in a distributed supply data centre comprising a plurality of data halls and a plurality of services areas. Additionally or alternatively, it may be that, when the UPS switchboard and the IT equipment is installed in the date centre, the data centre is configured so that both the UPS switchboard and the IT equipment that it directs power to are supplied with cooling air from the same air handling unit.

Preferably, the services area comprises at least one hot zone and at least one cold zone. Optionally, the at least one hot zone is separated from the at least one cold zone by at least one of (i) a UPS switchboard storage area and (ii) a partition, the UPS switchboard storage area being configured to accommodate at least one UPS switchboard. For example, it may be that once the UPS switchboard is accommodated in the UPS switchboard storage area, the UPS switchboard itself provides physical separation between the hot and cold zones. Preferably, in use, cooling air is supplied to the UPS switchboard storage area from the air handling unit via the cold zone of the services area. Optionally, when the services area comprises a partition separating the cold zone from the hot zone, the UPS switchboard storage area is positioned adjacent the partition.

Dividing the services area into a hot zone and a cold zone may improve cooling efficiency in the services area, for example because cooling air is supplied directly to the items of equipment to be cooled without mixing with warm air already used for cooling. Supplying the services area with cooling air from the air handling unit used to provide cooling air to IT equipment in the data centre may improve cooling efficiency because the large scale of the air handling unit. Furthermore, it may reduce maintenance requirements as compared to a data centre having a dedicated cooling system for its services area.

Preferably, the air handling unit is configured to supply cooling air meeting certain temperature and/or humidity requirements. For example, it may be that the air handling unit supplies conditioned air, that is, air that falls within pre-defined temperature limits and/or within pre-defined humidity limits.

Optionally, the air handling unit comprises an adiabatic cooling unit, such as a humidity-based cooling unit. Examples of suitable humidity-based cooling units include wetted matrix cooling units (in which air to be cooled is passed through a matrix of a wetted material, causing moisture on the material to evaporate into the air and lowering the temperature of the air) and/or spray cooling units. Suitable evaporative cooling units are described in PCT publication nos. WO2011/148175A1 and WO2016/193153A1, the contents of which are incorporated herein by reference. Additionally or alternatively, the air handling unit optionally comprises a mechanical cooling unit. It will be appreciated that a mechanical cooling unit is a cooling unit, such as a direct-expansion (DX) cooling unit. It may be that the mechanical cooling unit utilises a compressor to compress and condense a refrigerant that is circulated through a condenser coil by a pump. Allowing the refrigerant to expand and evaporate (e.g. by passing it through an expansion valve) into an evaporator coil extracts heat from air passing over the evaporator coil. Optionally, the air handling unit comprises a controllable air circulation system comprising at least one fan (preferably a plurality of fans). Preferably, the controllable air circulation system is configured to circulate cooling air from the air handling unit to the rack storage areas (thus to the IT equipment, if present) via at least one cold aisle (e.g. via the plurality of cold aisles). In other words, in use, air is transported from the air handling unit to the IT equipment substantially (e.g. entirely) under the control of the controllable circulation system. Optionally, the data centre is configured to utilise a controlled pressure regime in which an air pressure differential is maintained between the cold and hot aisles to encourage cooling air to flow from the cold aisles to the hot aisles.

It will be appreciated that the data centre may comprise a plurality of air handling units. Optionally, one air handling unit supplies a group of one or more cold aisles and a group of one or more services areas, while another air handling unit supplies another, separate, group of one or more cold aisles and another, separate, group of one or more service areas. For example, it may be that the data centre is configured so that each group of one or more cold aisles and each group of one or more services areas is supplied with cooling air only from one dedicated air handling unit. Alternatively, each group of one or more cold aisles and each group of one or more services areas is preferably configured to be supplied with cooling air from a plurality of air handling units. It will be appreciated that such an arrangement may, for example, allow for a whole air handling unit to be redundant.

Optionally, when the data centre is in use, warm air is transported from the hot aisles to at least one of i) the air handling unit, and ii) outside the data centre. For example, it may be that at least some of the warm air is recirculated to the air handling unit. Additionally or alternatively, it may be that at least some of the warm air is exhausted out of the data centre.

Optionally, the data centre is configured for free air cooling, such as direct free air cooling or indirect free air cooling.

Optionally, if the data centre is a direct air free air cooling data centre, the air handling unit comprises a single air flow path therethrough, the air flow path having an entrance and an exit. In use, air is supplied to the air handling unit via the entrance, is optionally conditioned (e.g. cooled/humidified/dehumidified), and then exits the air handling unit via the exit. Preferably, the entrance is in fluid communication with ambient air outside of the data centre and the exit is in fluid communication with cold aisles of the data centre. Optionally, the entrance is in fluid communication with ambient air outside the data centre and hot aisles of the data centre. Optionally, the data centre comprises a plurality of dampers for controlling how much, if any, ambient air is supplied to the entrance of the air handling unit, and optionally how much, if any, recirculated air from hot aisles is supplied to the entrance of the air handing unit. It will be appreciated that with such an arrangement, the entrance of the air handling unit may receive only recirculated air in some modes of operation. Optionally, when the air handling unit is supplied with ambient air and recirculated air, the ambient air and the recirculated air is mixed prior to its entry into the air handling unit. Optionally, the cooling air supplied to the IT equipment comprises ambient air and, optionally, recirculated air, optionally wherein the ambient air and recirculated air (if present) has been conditioned by the air handling unit to adjust its temperature and/or humidity. Suitable direct air cooling air handling units and control methodologies are disclosed in PCT publication nos. WO2010/139921 and WO2011/148175, the contents of which are incorporated herein by reference.

Optionally, if the data centre is an indirect free air cooling data centre, the air handling unit comprises an internal air flow path and an external air flow path, optionally wherein the internal and external air flow paths are segregated to inhibit cross-contamination. Preferably, the internal air flow path is in fluid communication with the inside of the data centre, such as with cold aisles of the data centre, and optionally with hot aisle(s) of the data centre. Preferably, the external air flow path is in fluid communication with ambient air outside the data centre. Preferably, the air handling unit comprises a heat exchanger for transferring heat from air in the internal air flow path to air in the external air flow path. Examples of suitable heat exchangers include heat tubes, plate exchangers and wheel exchangers, preferably heat tubes. Suitable indirect air cooling air handling units are described in PCT publication no. WO2016/207323, the contents of which are incorporated herein.

Preferably, the data centre is configured to utilise an above floor cooling regime. According to such a regime, the data centre may comprise a floor, wherein the rack storage areas are located on the floor, and wherein cooling air travels from the air handling unit to the cold aisles above the floor. For example, it may be that the cooling air flow path leading from the air handling system to the cold aisles is located substantially, such as entirely, above said floor of the data centre. Preferably, said cooling air flow path comprises a personnel area, such as an air supply corridor (e.g. a corridor having a height of at least 1.5 m, such as at least 2 m, above the floor), between the air handling unit and the cold aisles. Preferably, the data centre comprises an air supply corridor, the air supply corridor being in fluid communication with the air handling unit and the plurality of cold aisles. Optionally, the air supply corridor, together with the cold aisles, provides personnel access to the racks of IT equipment (e.g. to the front of the racks). Optionally, the data centre is configured so that warm air travels above the floor from the hot aisles to at least one of i) the air handling unit and ii) the outside of the data centre. For example, it may be that the warm air flow path leading from the hot aisles to at least one of i) the air handling unit and ii) the outside of the data centre is located substantially, such as entirely, above said floor of the data centre. Preferably, said warm air flow path comprises a personnel area, such as an air return corridor (e.g. a corridor having a height of at least 1.5 m, such as at least 2 m, above the floor), between the hot aisles and the air handling unit. Preferably, the data centre comprises an air return corridor, the air return corridor being in fluid communication with the plurality of hot aisles and the air handling unit. Optionally, the air return corridor, together with the hot aisles, provides personnel access to the racks of IT equipment (e.g. to the rear of the racks). Suitable data centre layouts are described in PCT publication no. WO2010/139921, the contents of which are incorporated herein by reference.

Preferably, the data centre comprises a shared cooling air supply path for transporting cooling air from the air handling unit to i) the rack storage areas and ii) the UPS switchboard storage area. In such an arrangement, there is fluid communication between i) the air handling unit, ii) the plurality of cold aisles, and iii) the cold zone of the services area. For example, it may be that the data centre is configured so that, in use, cooling air flows from the air handling unit into a cooling air supply space (such as an air supply corridor), and then from the cooling air supply space into i) a plurality of cold aisles, and ii) the cold zone of the services area. Optionally, the cooling air supply path comprises the air supply space, the plurality of cold aisles, and the cold zone of the services area. Preferably, the hot zone of the services area is in fluid communication with the cooling air supply space. According to such an arrangement, the cooling air supply path is configured to receive air from i) the air handling unit and ii) the hot zone of the services area. In such an arrangement, there is fluid communication between i) the air handling unit, ii) the plurality of cold aisles, iii) the cold zone of the services area, and iv) the hot zone of the services area. It will be appreciated said fluid communication between the plurality of cold aisles and the hot zone of the services area is not only via the cold zone of the services area. For example, in use, warm air from the hot zone of the services area flows directly into the cooling air supply path. Preferably, in use, warm air from the hot zone is mixed with cooling air supplied by the air handling unit prior to the cooling air being supplied to the cold aisles.

Preferably, the data centre comprises a cooling air supply space, the cooling air supply space being configured to receive air directly from the air handling unit and to receive air directly from the hot zone of the services area, and the cooling air supply space being configured to supply air directly to one or more cold aisles (preferably directly to a plurality of cold aisles) and to supply air directly to the cold zone of the services area. It will be understood that air is supplied directly from one area to another at least when it is able to pass between said areas without passing through i) the air handling unit, ii) a UPS switchboard storage area, or iii) a rack storage area. It may be that the cooling air supply space is sub-divided into a plurality of interconnected zones. Optionally, the cooling air supply space comprises an air supply corridor. Preferably, the air supply corridor is configured to supply air directly into the cold aisles. Optionally the air supply corridor provides personnel access to the cold aisles, and thus to the rack storage areas. Optionally, the air supply corridor is configured to supply air directly into the cold zone of the services area. Optionally the air supply corridor provides personnel access to the cold zone, and thus to the UPS switchboard storage area. Optionally, the air supply corridor comprises a personnel barrier to prevent unauthorised passage of persons along the air supply corridor, wherein the personnel barrier is configured to allow air to flow freely along the air supply corridor (e.g. the personnel barrier is in the form of a grill or cage, optionally having a door). Optionally, the cooling air supply space comprises an air mixing chamber, for example an air mixing chamber located upstream of the air supply corridor (that is, between the air supply corridor and the air handling unit). Preferably, the air mixing chamber is configured to receive cooling air from the air handling unit (optionally directly from the air handling unit) and to receive warm air from the hot zone of the services area (optionally directly from the hot zone of the services area). With such an arrangement, the services area is configured to 1) extract cooling air from the cooling air path and 2) return warm air into the cooling air path. In other words, in use, a portion of the cooling air supplied to the rack storage areas from the air handling unit travels via the services area (e.g. via the cold zone and via the hot zone), for example wherein the portion is no more than 25%, such as no more than 20%, for example no more than 10% by flow rate (volume/time). For example, if the flow rate of cooling air between the air handling unit and the cold aisles is 50 m$^3$/s, 5 m$^3$/s circulates through the services area when the portion is 10%. Optionally, the portion is at least 1%, such as at least 3%, for example at least 5% by flow rate (volume/time). Optionally, the air supply corridor provides personnel access to the mixing chamber. Optionally, the mixing chamber provides personnel access to the hot zone of the services area. Optionally, the data centre comprises an opening between the mixing chamber and the air supply corridor, wherein the opening comprises an air blender.

It has been found that returning warm air from the services area to a point along the cold air flow path downstream of the air handling unit and upstream of the cold aisles provides a particularly cost-effective and efficient means of cooling both IT equipment in the rack storage areas and UPS equipment in the services area. It will be appreciated that the cooling air demands of a data centre cold aisle (which typically supplies cooling air to two rows of densely packed racks of IT equipment) are often high. As cold aisles are fed with large volumes of cooling air, the hot aisles generate correspondingly large volumes of air typically having a temperature considerably higher than that of the air fed to the cold aisles. In comparison to a plurality of cold aisles, the cooling air requirements of a data centre services area tend to be small. Thus, while the warm air exiting the hot zone of the services area may have a relatively high temperature (for example at least 10° C. warmer than the cooling air supplied to the cold zone of the services area), the volume of warm air exiting the hot zone as compared to the volume of air flowing along the cooling air supply path from the air handling unit to the cold aisles may be relatively small (for example, it may be that less than 10% of the total volume of air flowing from the air handling unit to the cold aisles travels via the services area. With such an arrangement, it may be that the cooling air supplied to the cold aisles (which comprises air supplied directed from the air handling unit mixed with warm air from the hot zone of the services area) has a temperature around 1° C. higher than the temperature of the cooling air as it exits the air handling unit. To compensate for that temperature difference, it may be that the air handling unit cools the cooling air to a temperature slightly lower (e.g. 1° C. lower in this example) than the cooling air temperature specified required for the IT equipment. It will be appreciated, however, that with such an arrangement, there is no loss in overall airflow rate between the air handling unit and the cold aisles, regardless of how much of the cooling air flows via the services area (i.e. if the air flow rate out of the air handling unit is 50 m$^3$/s, provided that there is no leakage out of the airflow path, the air flow rate to the cold aisles is also 50 m$^3$/s, irrespective of the cooling air demands of the services area). On the other hand, if the warm air from the hot zone of the services area were to be fed to a point upstream of the air handling unit (i.e. into the warm airflow path between the hot aisles and the air handling unit, the air handling unit may need to be able to supply cooling air at a flow rate higher than that required for the cold aisles in order to meet the cooling requirements of the IT equipment.

It is often the case that the cooling capacity of an air handling unit is limited by the flow rate of cooling air that it is capable of supplying. It has been found that individual server fans are typically configured by the server manufacturer to operate at a set speed, irrespective of the temperature of server components (i.e. the server will draw the same volume of cooling air, regardless of the temperature of the cooling air). Thus, to provide adequate cooling capacity, the air handling unit should be able to supply x m$^3$/s of cooling air to the cold aisles (where x represents the total cooling airflow required by all servers in the data centre when all racks located along all cold aisles supplied by the air handling unit are full). When warm air from the services area is returned to the cooling airflow path between the air handling unit and the cold aisles, the air handling unit still needs to be capable of providing x m$^3$/s of cooling air. If warm air is not so returned, the air handling unit may need to be capable of supplying x+y m$^3$/s of cooling air (x as previously defined, y represents the total cooling airflow required by services area). It is often the case that cooling equipment in an air handling unit has a maximum threshold for air velocity, for example 5 m/s. Thus, it may be necessary to provide a larger air handler having an increased amount of equipment to supply x+y m$^3$/s of cooling air. It will be appreciated that the services area may be able to be cooled using the IT equipment air handling unit without increasing the cooling capacity of the air handling unit when the services area is configured to return warm air to the cooling airflow path. Thus, with such an arrangement, the data centre operator can make use of the large scale efficiencies provided by the said air handling unit without increasing the capacity of said air handling unit.

It will be appreciated that the air handling unit may optionally be comprised in an air handling assembly, such as an air handling assembly comprising one or more air handling modules. Optionally, the air handling unit is comprised in one or more of the air handling modules. For example, the air handling assembly optionally comprises one or more modules selected from i) an adiabatic cooling module comprising an adiabatic cooling unit, ii) a controllable air circulation system module comprising at least one fan, and iii) a mechanical cooling module comprising at least one mechanical cooling unit. Optionally, the or each module comprises a floor, and optionally a frame and/or one or more sidewalls and/or a ceiling. Preferably, the or each module is configured to be housed within another structure. Preferably, the air handling assembly is configured for manufacture at a manufacturing site remote to the data centre installation site, for example wherein the air handling module(s) is/are transportable from the remote manufacturing site to the installation site. It will be appreciated that the air handling assembly may define at least a portion of the cooling air supply space for transporting cooling air, if present. For example, it will be appreciated that the air mixing chamber configured to receive cooling air from the air handling unit and warm air from the hot zone of the services area may optionally be comprised in the air handling assembly. For example, the air handling assembly may optionally comprise a mixing chamber module comprising the mixing chamber. Optionally, the mixing chamber module comprises one or more controllable booster fans for drawing air from the hot zone of the services area into the mixing chamber. It will be appreciated that the booster fan(s) may optionally be the booster fan(s) described herein below, e.g. as described with reference to the services area. Optionally, the air handling assembly comprises one or more noise attenuation devices for attenuating fan noise. Any suitable noise attenuation device may be used, such as a device comprise a plurality of panels of sound-absorbing arranged to absorb noise from a flow of air. Optionally, the air handling assembly comprises a noise attenuation module comprising such a noise attenuation device. Optionally, the noise attenuation device is arranged or configured for arrangement downstream of the air handling unit. Optionally, such a noise attenuation device is provided in or adjacent the air mixing chamber. For example, the air handling assembly may optionally comprise a combined air mixing chamber and noise attenuation module. Optionally, the air handling assembly comprises one or more filters for filtering particulate materials from air processed by the air handling unit. Optionally, the air handling assembly comprises a filter module comprising one or more such filters. Optionally, the one or more filters are arranged or configured for arrangement upstream of the air handling unit.

Preferably, the data centre comprises a warm air return path leading from at least one hot aisle (preferably a plurality of hot aisles) to the air handling unit. Optionally, the data centre comprises a warm air return space for transporting warm air from the plurality of hot aisles to the air handling unit.

Preferably, the data centre comprises a climate control system comprising a controller and a plurality of sensors, the climate control system being configured to automatically control operation of the air handling unit in response to measurements made by the plurality of sensors. Optionally, the sensors include one or more of temperature, humidity and pressure sensors. Optionally, sensors are positioned in locations including one or more of (i) the cooling air supply space, (ii) the cold aisles, (iii) the hot aisles, (iv) the cold zone of the services area, and optionally (v) the hot zone of the services area, and optionally (vi) the warm air return space, if present. Optionally, the sensors are configured to measure one or more of (i) temperature and/or humidity in the cooling air supply space, temperature and/or humidity in the cold zone of the services area, (iii) temperature and/or humidity in the warm air return space, (iv) air pressure in the cold aisles, and (v) air pressure in the hot aisles. It may be that air pressure in the cold and hot aisles is measured in terms of the pressure differential between the cold and hot aisles rather than in terms of absolute pressure measurements in each aisle. Optionally, the speed of one or more fans of the air handling unit are adjusted automatically by the climate control system in response to the measured pressure differential between the cold and hot aisles (e.g. in order to maintain a higher pressure in the cold aisles). Optionally, operation of cooling equipment in the air handling unit is adjusted automatically by the climate control system in response to the measured temperature and/or humidity in the cooling air supply space. Preferably, when the data centre is configured so that warm air from the hot zone of the services area is returned to the cooling air supply space, at least one temperature and/or humidity sensor is provided downstream of the return point (i.e. between the cold aisles and the location that warm air from the hot zone enters the cooling air supply space). It will be appreciated that any item of equipment related to air flow in the data centre and referred to as 'controllable' or 'adjustable' may be automatically controlled by the climate control system in response to temperature/humidity/pressure measurements of the sensors. Preferably the controller of the climate control system (e.g. a computer) is pre-programmed with maximum (and optionally minimum) allowable thresholds for temperature, humidity and/or air pressure (e.g. air pressure differential between cold and hot aisles), wherein the climate control system operates to maintain temperature, humidity and air pressure in the data centre below/within those thresholds by automatically controlling those items of equipment connected to the climate control system. As used herein, the control system controls equipment automatically when, once configured, it is capable of sending control signals to said equipment without requiring input from a human operator.

Optionally, each cold aisle is provided with an adjustable vent for admitting cooling air into the cold aisle. For example, in use, cooling air may flow from the cooling air supply space (e.g. an air supply corridor) into each cold aisle through the adjustable vent. Optionally, the adjustable vent is controllable to regulate the amount of cooling air flowing into the cold aisle. Optionally, the adjustable vent is automatically controlled by the climate control system, for example in response to the measured air pressure differential between the cold aisle and adjacent hot aisle(s). Preferably, the adjustable vent comprises a plurality of movable louvres, for example a plurality of louvres adjustable at least between 1) a first, fully open position, 2) a second, partially open position, and 3) a third, substantially closed position. Optionally, each cold aisle is provided with a door assembly for controlling personnel access to the cold aisle, for example from the cooling air supply space (e.g. an air supply corridor). Preferably, the adjustable vent is integral to the door assembly. For example, it may be that the door assembly comprises a doorframe and a door, wherein the door comprises the adjustable vent. Optionally, the services area is provided with an adjustable vent for admitting cooling air into the cold zone of the services area. For example, it may be that, in use, cooling air flows from the cooling air supply space (e.g. an air supply corridor) into the cold zone through the adjustable vent. Optionally, the adjustable vent is controllable to regulate the amount of cooling air flowing into the cold zone. Optionally, the adjustable vent is automatically controlled by the climate control system, for example in response to measured temperature and/or humidity in the cold zone. Preferably, the adjustable vent comprise a plurality of movable louvres, for example a plurality of louvres adjustable at least between 1) a first, fully open position, 2) a second, a second, partially open position, and 3) a third, substantially closed position. Optionally, the cold zone is provided with door assembly for controlling personnel access to the cold zone, for example from the cooling air supply space (e.g. an air supply corridor). Preferably, the adjustable vent is integral to the door assembly. For example, it may be that the door assembly comprises a doorframe and a door, wherein the door comprises the adjustable vent. Suitable door arrangements for the cold aisles and/or the services area are disclosed in PCT publication no. WO2010/139921, the contents of which are incorporated herein by reference.

Optionally, the data centre comprises a UPS power supply area, such as a battery storage area. Preferably, the UPS power supply area is configured to accommodate one or more UPS power sources, such as a plurality of batteries. It may be that the UPS power supply area is separate to the services area, for example separated by a partition or wall (it will be appreciated that such a partition or wall may nevertheless comprise a door for allowing personnel access between the services area and the UPS power supply area). It may be that the UPS power supply area is integral to the services area. Optionally, the UPS power supply area comprises a UPS power source, such as a plurality of batteries.

Optionally, when the services area comprises a partition separating the cold zone from the hot zone, the partition provides a fire barrier between the zones, such as a fire barrier having a 1-hour rating, such as a 1-hour integrity (and optionally insulation) rating, or better. Optionally, the fire barrier achieves a 1-hour integrity/insulation rating according to BS:476, especially BS:476-22 (as in effect on 1 Aug. 2018). Optionally, the services area comprises a partition separating the cold zone of the services area from the cooling air supply space of the data centre, optionally wherein the partition provides a fire barrier between the cold zone and the cooling air supply space. Preferably, the partitions are contiguous. Optionally, the services area comprises a single fire barrier separating the cold zone from (i) the hot zone and (ii) the cooling air supply space. It will be appreciated that it may be desirable to provide fireproof segregation between sections of a data centre, and that the equipment in the services area may present a fire risk. Optionally, the fire barrier comprises one or more fire door assemblies comprising a fire door. Preferably, the fire door assembly is comprised in a section of fire barrier separating the cold zone of the services area from the air supply space. Optionally, when the cold zone is provided with door assembly for controlling personnel access to the cold zone, for example from the cooling air supply space (e.g. an air supply corridor), the door assembly comprises a movable fire barrier, such as a fire door. Preferably, when the door assembly comprises a door comprising an adjustable vent, the door assembly additionally comprises a movable fire barrier, such as a fire door. For example, it may be that the data centre comprises a personnel opening between the cold zone and the cooling air supply space, wherein the personnel opening comprises a movable fire barrier and a door having an adjustable vent (i.e. a vented door). It may be that the data centre is configured so that, in normal operation, the fire door can be held open so that personnel access through the opening is controlled by the vented door, and so that, in the event of a fire, the fire door closes, e.g. closing automatically in response to a signal received from a fire control system. For example, it may be that the fire door has a first, open position in which personnel access to the cold zone is controlled by the door comprising the adjustable vent, and a second, closed position in which the fire door provides a fire barrier across the door assembly. Optionally, the fire barrier comprises at least one airflow opening between the cold zone and the hot zone, wherein the at least one airflow opening comprises a fire damper. Preferably, each such opening comprises a fire damper. It may be that the data centre is configured so that, in normal operation, the fire damper is held in an open position in which air is able to flow from the cold zone to the hot zone, and so that, in the event of a fire, the fire damper closes, e.g. closing automatically in response to a signal received from a fire control system. Preferably the data centre comprises a fire control system comprising a controller and a plurality of sensors. Preferably, the plurality of sensors includes one or more smoke, heat and/or flame sensors. Optionally, the fire control system is configured to activate automatically one or more fire dampers and fire doors, e.g. to prevent the spread of fire and/or smoke through the data centre. Optionally, the fire control system is configured to activate automatically or with human approval one or more fire suppression systems, including water sprinkler and/or inert gas fire suppression systems.

Preferably, the UPS switchboard storage area of the services area accommodates at least one UPS switchboard having at least one fan (e.g. an integral fan), such as plurality of UPS switchboards each having at least one fan (e.g. integral fans). Preferably, the, or each, UPS switchboard comprises an air inlet and an air outlet. Optionally, the integral fan (if present) is configured to circulate air through the UPS switchboard from the air inlet to the air outlet. Preferably, the data centre is configured so that, in use, the inlet of the UPS switchboard receives air from the cold zone of the services area, and so that the hot zone of the services area receives air from the air outlet of the UPS switchboard.

Optionally, the services area comprises at least one opening between the cold zone and the hot zone, for example an opening in a partition separating the cold zone from the hot zone. Optionally, the services area comprises one or more ducts (e.g. in the form of one or more hoods) for channeling air from the air outlet of the UPS switchboard to the hot zone. Preferably, the one or more ducts comprise one or more intake openings for receiving warm air from the outlet(s) of the UPS switchboard(s), and optionally one or more exhausts for exhausting said warm air to the hot zone. Optionally, each intake opening is connected to a UPS switchboard outlet, optionally wherein the duct provides an enclosed air flow path from said outlet of the UPS switchboard to the hot zone (e.g. wherein the duct segregates air exiting an outlet of a UPS switchboard from air in the cold zone of the services area). It may be that such an arrangement helps to avoid warm air exiting the UPS switchboard outlet from returning to the cold zone. Alternatively, each intake opening is aligned with and spaced apart from an outlet of a UPS switchboard (e.g. wherein the intake opening is aligned with the outlet and spaced apart from the outlet by no more than 10 cm, e.g. no more than 5 cm, such as no more than 2 cm). It may be that such an arrangement encourages warm air exiting the UPS switchboard to flow into the hot zone rather than the cold zone while also allowing air from the cold zone to bypass the UPS switchboard. It will be appreciated that since air in the cold zone may be warmed by contact with electrical equipment other than the UPS switchboard, and so allowing air bypass the UPS switchboards may allow for increased flow of cooling air into the cold zone. It may be that when the intake opening(s) of the duct(s) are spaced apart from the outlet(s) of the UPS switchboard(s), warm air exiting the UPS switchboards is able to flow back into the cold zone in the event of the one or more openings between the cold and hot zones being closed, e.g. by a fire damper located in the openings. It will be appreciated that a plurality of switchboards may share a common duct, for example a duct having multiple openings for receiving air from the outlets of the UPS switchboards. Optionally, each exhaust is connected to an opening in a partition separating the cold zone from the hot zone.

Optionally, when the services area comprises one or more ducts having intake openings connected to a UPS switchboard outlet, the one or more ducts comprise one or more bypass intake openings for receiving air directly from the cold zone. Preferably, the one or more bypass intake openings comprise an adjustable vent, e.g. an adjustable vent movable between i) a first closed position in which flow of air through the adjustable vent into the duct is inhibited, and ii) a second open position in which air is able to flow through the adjustable vent into the duct. Optionally, the adjustable vent is automatically controlled by the climate control system, for example in response to measured temperature and/or humidity in the cold zone. Additionally or alternatively, a partition between the cold and hot zones comprises one or more bypass openings not connected to a duct, the bypass openings being configured to allow air to pass from the cold zone to the hot zone without passing through the UPS switchboards. Preferably, the one or more bypass openings comprise an adjustable vent, e.g. an adjustable vent movable between i) a first closed position in which air cannot flow through the adjustable vent from the cold zone to the hot zone, and ii) a second open position in which air is able to flow through the adjustable vent from the cold zone to the hot zone. Optionally, the adjustable vent is automatically controlled by the climate control system, for example in response to measured temperature and/or humidity in the cold zone. Optionally, the cold zone of the services area comprises a floor and a ceiling, wherein the bypass opening is positioned closer to the ceiling than the floor, e.g. adjacent the ceiling. Optionally, the bypass opening is positioned in the ceiling. Optionally, the bypass opening comprises a controllable fan for circulating air from the cold zone to the hot zone, such as a fan controlled automatically by the climate control system, for example in response to measured temperature and/or humidity in the cold zone.

Optionally, the hot zone of the services area comprises one or more controllable booster fans for expelling air from the hot zone, and optionally into the cooling air supply space or into the warm air return space, e.g. into a mixing chamber. It will be appreciated that the booster fan may be arranged to push or pull air through the hot zone. Optionally, the booster fan is controlled automatically by the climate control system, for example in response to measured temperature and/or humidity in the cold zone. It will be appreciated that the one or more booster fans may be located at any convenient location in the data centre. For example, the one or more booster fans may be comprised in a services area module, and/or comprised in the air handling unit and/or the air handling assembly. Optionally, the air handling assembly comprises a duct for receiving air from the hot zone of the services area and transporting air into the cooling air supply space, such as into a mixing chamber. Preferably, when the air handling assembly comprises such a duct, the air handling assembly comprises one or more booster fans in the duct to draw air from the hot zone of the services area through the duct and into the cooling air supply space.

Optionally, the data centre is configured so that, in a first mode of operation, air is circulated from the cold zone to the hot zone of the services area via the UPS switchboard and substantially under the control of one or more fans integral to the UPS switchboard(s). It may be that such an arrangement provides a particularly efficient manner of controlling airflow through the cold zone and through the UPS switchboard. Optionally, the data centre is configured so that, in a second mode of operation, air is circulated from the cold zone to the hot zone of the services area via the UPS switchboard and substantially under the control of the one or more booster fans. It may be that such an arrangement provides a backup means of drawing cooling air through the UPS switchboard, and/or a means of increasing such airflow if needed. Optionally, in the first and/or second mode of operation, substantially all of the air passing from the cold zone to the hot zone circulates through the UPS switchboard (s). Optionally, in the second mode of operation, at least a portion of the air passing from the cold zone to the hot zone bypasses the UPS switchboard.

Preferably, the services area accommodates at least one electrical switchboard, such as a plurality of electrical switchboards. Preferably, the electrical switchboard is configured to be connected to an external power source (such as a power distribution network) and to an on-site backup electrical supply (e.g. to one or more on-site generators). Preferably, the electrical switchboards are accommodated in the cold zone of the services area.

Preferably, the data centre is configured so that, in use, electrical power from an external power distribution network is supplied to electrical equipment in the data centre via an electrical switchboard and via a UPS switchboard, for example wherein electrical power from the external power source first passes through an electrical switchboard, then through a UPS switchboard, then back through the electrical switchboard and finally to the electrical equipment. Electrical equipment may include e.g. IT equipment mounted in racks in the rack storage areas and/or mechanical equipment such as the air handling unit. Preferably, the UPS switchboard is operable in a plurality of modes including, for example, (i) bypass mode in which electrical power supplied to the rack storage areas bypasses the UPS power source, (ii) eco mode in which a portion of electrical power passes through the UPS power source (thus allowing trickle charging of the UPS power source), (iii) double conversion mode in which all power passes through the UPS power source, and (iv) discharge mode in which all power is supplied by the UPS power source. It will be appreciated that in modes (i) to (iii), power is supplied by an external power source. Modes (i) to (iii) provide a balance between UPS responsiveness, power efficiency and heat generation. In bypass mode, the UPS system provides its maximum efficiency (since no power is lost by passage through the UPS power source), least responsiveness (since the UPS switchboard has to connect the UPS power source to the electrical circuit and begin converting between DC and AC, e.g. when batteries are the UPS power source), and least heat generation (since the UPS switchboard is not converting electrical current from AC to DC and back to AC). In double conversion mode, the UPS system provides its minimum efficiency (since all power is passed through the UPS power source), maximum responsiveness (since the UPS power source is able to instantaneously step in to supply power if there is a loss of power from the external power source), and most heat generation (since all electrical current in the circuit is being converted from AC to DC and back to AC). In practice, bypass mode is likely only to be used during maintenance of the UPS system, and discharge mode is only used upon failure of the external power supply. Risk averse data centre operators may continuously operate UPS systems in double discharge mode, while others may prefer the efficiency gain of operating in eco mode.

Optionally, the data centre comprises at least one IT electrical circuit configured to provide electrical power to the rack storage areas (and thus to IT equipment located in the rack storage areas when present). Preferably, the at least one IT electrical circuit extends between the services area and a plurality of rack storage areas. Preferably, the at least one IT electrical circuit is connected to one or more UPS switchboards in the services area, and optionally to at least one electrical switchboard in the services area. Optionally, the data centre comprises at least one mechanical electrical circuit, such as a mechanical electrical circuit configured to provide electrical power to mechanical equipment (e.g. the air handling unit) in the data centre. Preferably, the least one mechanical electrical circuit extends between the services area and a plurality of rack storage areas. Preferably, the at least one mechanical electrical circuit is connected to one or more UPS switchboards in the services area, and optionally to at least one electrical switchboard in the services area. Optionally, the IT electrical circuit and the mechanical electrical circuit are provided with independent, dedicated electrical switchboards and with independent, dedicated UPS switchboards.

Optionally, the data centre comprises a plurality of services areas, for example a main services area and a backup services area. Optionally, the data centre comprises a plurality of IT zones, each IT zone comprising a plurality of hot aisles interleaved with a plurality of cold aisles, wherein each hot aisle is separated from an adjacent cold aisle by a rack storage area, each rack storage area being arranged to accommodate a row of racks of IT equipment. Optionally, the data centre comprises a plurality of air handling units. It may be that each IT zone is provided with an independent, dedicated air handling unit. It may be that each IT zone is provided with a dedicated services area. Alternatively, it may be that each IT zone is provided with electrical power from two services area, and that each services area provides electrical power to two IT zones. It may be that with such an arrangement, in the event of failure of one services area, the each IT zone supplied by that services area can fall back on the other services area connected to that IT zone. Optionally, the services area and its associated IT zone are supplied with cooling air from the same air handling unit.

Optionally, the data centre comprises at least one main IT electrical circuit and at least one backup IT electrical circuit (e.g. 'A' and 'B' IT electrical circuits), wherein the main and backup circuits are configured to provide main and backup electrical power to the rack storage areas (and thus to IT equipment located in the rack storage areas when present). For example, it may be that, in use, each item of IT equipment in a rack storage area is connected to at least one main IT electrical circuit and to at least one backup IT electrical circuit. It will be appreciated that with such an arrangement, the IT equipment is able to continue operation after failure of the main electrical circuit by switching from the main to the backup supply. Optionally, the data centre comprises at least one main mechanical electrical circuit and at least one backup mechanical electrical circuit (e.g. 'A' and 'B' mechanical electrical circuits), wherein the main and backup circuits are configured to provide main and backup electrical power to mechanical equipment (e.g. the air handling unit) in the data centre. For example, it may be that, in use, the or each air handling unit is connected to at least one main mechanical electrical circuit and to at least one backup mechanical electrical circuit. Optionally, the main IT electrical circuit and the main mechanical electrical circuit are substantially (e.g. entirely) independent of each other. Optionally, the backup IT electrical circuit and the backup mechanical electrical circuit are substantially (e.g. entirely) independent of each other. Optionally, the main and backup IT and mechanical electrical circuits are each provided with independent, dedicated electrical switchboards and with independent, dedicated UPS switchboards.

The terms 'main electrical circuit' and 'backup electrical circuit' are used herein only to clearly distinguish between the two circuits, and not to imply that one circuit is used in preference to the other. For example, it may be that the data centre is configured so that, in use, power consumption is distributed across main and backup circuits.

Optionally, the services area is configured to accommodate electrical switchboards and UPS switchboards connected to main and backup IT and mechanical electrical circuits. Alternatively, when the data centre comprises a plurality of services areas, each services area may be configured to accommodate electrical switchboards and UPS switchboards connected either to main IT and mechanical electrical circuits or to backup IT and mechanical electrical circuits. For example, it may be that each services area is configured to accommodate one or more electrical switchboards and one or more UPS switchboards connected to the main IT and mechanical circuits for one IT zone and one air handling unit. Furthermore, it may be that said one or more electrical switchboards and one or more UPS switchboards are additionally connected to the backup IT and mechanical circuits for another IT zone and another air handling unit.

Preferably, the cold zone of the services area comprises a personnel area. Preferably, the personnel area has a height of at least 1.5 m, such as a height of at least 2 m. Preferably, the personnel area provides personnel access to the at least one UPS switchboard storage area, such as to the plurality of UPS switchboard storage areas. Optionally, when the services area accommodates one or more electrical switchboards, the personnel area provides personnel access to the or each electrical switchboard. Preferably, the services area is configured such that, in use, cooling air supplied by the air handling unit travels to the at least one UPS switchboard via the personnel area of the cold zone.

Preferably, the data centre is a modular data centre, for example a data centre made up of a plurality of discrete structural sections connected together to form a unitary structure. Preferably, at least one personnel area (such as a personnel area selected from the list consisting of a cold aisle, a hot aisle, an air supply corridor, and an air return corridor) spans at least two sections. Additionally or alternatively, the services area is optionally formed by one or more modules. For example, it may be that at least a portion of the services area (such as at least a portion of, or the whole, cold zone) is comprised in a single module. Optionally the whole of the services area (including the cold zone and the hot zone) is comprised in a single module. Alternatively, at least a portion of the cold zone and at least a portion of the hot zone is comprised in a single module. Optionally, the module comprises a floor, and optionally a frame and/or one or more sidewalls and/or a ceiling. Preferably, the module is configured to be housed within another structure.

According to a second aspect of the invention, there is provided a method of cooling electrical equipment in a services area of a data centre, the data centre comprising: (a) a plurality of hot aisles interleaved with a plurality of cold aisles, wherein each hot aisle is separated from an adjacent cold aisle by a rack storage area, each rack storage area being arranged to accommodate a row of racks of IT equipment; and (b) an air handling unit; wherein the services area of the data centre is a services area for accommodating at least one uninterruptible power supply (UPS) switchboard for directing electrical power to a plurality of racks of IT equipment, and the services area comprises at least one hot zone and at least one cold zone, the at least one hot zone being separated from the at least one cold zone by at least one of (i) a UPS switchboard storage area and (ii) a partition, the UPS switchboard storage area accommodating at least one UPS switchboard; and wherein the method comprises supplying cooling air to the rack storage areas from the air handling unit via the cold aisles, and supplying cooling air to the UPS switchboard storage area from the air handling unit via the cold zone of the services area.

Preferably, the data centre comprises a cooling air supply space, and the method comprises supplying via the cooling air supply space cooling air from the air handling unit to i) the plurality of cold aisles, and ii) the cold zone of the services area. Preferably, the method comprises supplying to the cooling air supply space i) cooling air from the air handling unit and ii) warm air from the hot zone of the services area.

Optionally, the air handling unit comprises a controllable air circulation system comprising at least one fan, and the method comprises operating the controllable air circulation system to circulate air from the air handling unit to the rack storage areas. Optionally, at least a portion of the air supplied to the plurality of cold aisles from the air handling unit is supplied via the services area.

Preferably, the data centre is a data centre according to the first aspect of the invention.

Preferably, the data centre comprises a climate control system comprising a controller and a plurality of sensors, such as a climate control system as described in relation to the first aspect of the invention. Optionally, the method comprises operating the climate control system to automatically control operation of the air handling unit. Optionally, the climate control system automatically controls operation of the air handling unit in dependence on (i) measured pressure differential(s) between cold and hot aisles and (ii) pressure differential thresholds pre-programmed into the controller. Additionally or alternatively, the climate control system automatically controls operation of the air handling unit in dependence on (i) measured temperature and/or humidity levels and (ii) maximum (and optionally minimum) temperature/humidity level thresholds pre-programmed into the controller.

Preferably, the cold zone of the services area comprises an air inlet having an adjustable vent, optionally an inlet comprised in a door of a door assembly for controlling personnel access to the cold zone, wherein the method comprises operating a climate control system to automatically control operation of the adjustable vent to regulate airflow into the cold zone of the services area. Preferably, the adjustable vent is so controlled in dependence on (i) temperature and/or humidity measurements from one or more sensors located in the cold zone of the services area and (ii) maximum (and optionally minimum) temperature and/or humidity thresholds pre-programmed into the controller of the climate control system.

Preferably, the UPS switchboard accommodated in the UPS switchboard storage area has an air inlet and an air outlet. Preferably, the air inlet is configured to receive air from the cold zone of the services area, and the air outlet is configured to expel air to the hot zone of the services area. Optionally, the UPS switchboard comprises at least one integral fan. Optionally, the method comprises, in a first mode of operation, circulating air from the cold zone of the services area to the hot zone of the services area via the UPS switchboard substantially under the control of the at least one fan of the UPS switchboard. Optionally, the data centre comprises at least one controllable booster fan for transporting air out of the hot zone of the services area. Optionally, the method comprises, in a second mode of operation, circulating air from the cold zone of the services area to the hot zone of the services area via the UPS switchboard substantially under the control of the at least one controllable booster fan. Optionally, the booster fan is controlled in dependence on temperature and/or humidity measurements made by one or more a temperature and/or humidity sensors located in the cold zone of the services area. Optionally, the method comprises operating the climate control system to automatically control operation of the booster fan. Preferably, the booster fan is so controlled in dependence on (i) temperature and/or humidity measurements from one or more sensors located in the cold zone of the services area and (ii) maximum (and optionally minimum) temperature and/or humidity thresholds pre-programmed into the controller of the climate control system.

Optionally, the data centre comprises an opening between the cold zone and the hot zone of the services area, the opening comprising an adjustable vent. Optionally, the method comprises moving the adjustable vent between i) a first closed position in which airflow through the adjustable vent between the cold zone and the hot zone is inhibited, and ii) a second open position in which airflow through the adjustable vent between the cold zone and the hot zone is allowed. Preferably, the opening is a bypass opening, e.g. providing a bypass air flow route that allows air to pass from the cold zone to the hot zone without passing through the UPS switchboard. Optionally, the method comprises, in a third mode of operation, circulating air through the at least one adjustable vent substantially under the control of the at least one booster fan, optionally wherein the method additionally comprises circulating air through the UPS switchboard substantially under the control of the at least one booster fan. Optionally, the method comprises operating the climate control system to automatically control operation of the adjustable vent. Preferably, the adjustable vent is so controlled in dependence on (i) temperature and/or humidity measurements from one or more sensors located in the cold zone of the services area and (ii) maximum (and optionally minimum) temperature and/or humidity thresholds pre-programmed into the controller of the climate control system.

Preferably, the services area accommodates a plurality of electrical switchboards in the cold zone of the services area. Preferably, the method comprises cooling the plurality of electrical switchboards with cooling air supplied to the cold zone of the services area from the air handling unit.

According to a third aspect, the present invention provides a method of cooling equipment in a data centre, wherein the data centre includes: a plurality racks of IT equipment in a first area; at least one uninterruptible power supply (UPS) switchboard in a second area, wherein the UPS switchboard is for directing electrical power to racks of IT equipment; a cooling air plenum in a third area; and, an air handling unit for supplying cooling air; wherein the method comprises the following steps: (a) using the air handling unit to supply a first cool air stream into the cooling air plenum; (b) directing a second cool air stream from the cooling air plenum to the second area to cool the at least one UPS switchboard, thereby generating a third warm air stream; (d) mixing the third warm air stream with cool air in or from the cooling air plenum to form a fourth mixed air stream; and (e) directing at least a portion of the fourth mixed air stream to the first area to cool the IT equipment. For example, it may be that the data centre comprises an air flow path extending from an upstream location adjacent the air handling unit to a downstream location adjacent the first area, the air flow path having an airflow splitting point and an airflow mixing point, wherein the airflow splitting point is the position at which a portion of air flowing along the airflow path is directed towards the first area and another portion of the air is directed towards the second area, and wherein the airflow mixing point is the position at which the third warm air stream joins the airflow path. It may be that when the third warm air stream is mixed with cool air in the cooling air plenum, the airflow mixing point is downstream of the airflow splitting point. It may be that when the third warm air stream is mixed with cool air from the cooling air plenum, the airflow mixing point is upstream of the airflow splitting point.

Optionally, the method comprises mixing the third warm air stream with cool air in the cooling air plenum, for example by directing the third warm air stream into the cooling air plenum. It may be that in such an arrangement the third warm air stream is mixed with the first cool air stream, for example such that the second cool air stream and the fourth mixed air stream have substantially the same composition. It may be that when the airflow mixing point is upstream of the airflow splitting point, mixing of air in the fourth mixed air stream can be conveniently improved. It will be appreciated that in such a configuration, the airflow rate in the portion of the airflow path between the airflow mixing point and the airflow splitting point is higher than in an arrangement where the airflow mixing point is downstream of the airflow splitting point. Thus, by inclusion of an air mixing device, such as air mixing baffles, between the airflow mixing point and the airflow splitting point, the relatively high velocity of airflow can assist in effectively mixing the air.

Optionally, the method comprises mixing the third warm air stream with cool air from the cooling air plenum, for example by directing the third warm air stream into a mixing chamber separate to the cooling air plenum. It may be that in such an arrangement, the cooling air in the cooling air plenum that is not directed to the second area as the second air stream is directed to the mixing chamber and mixed with the third warm air stream, for example such that the second cool air stream and the fourth mixed air stream have substantially different compositions.

Optionally, the second area is separate to the first area. Optionally, the third area is separate to the first area and/or separate to the second area.

Optionally, the step of directing the fourth mixed air stream to first area to cool the IT equipment generates a fifth warm air stream, and wherein the method additionally comprises directing the fifth warm air stream to at least one of (i) the air handling unit and (ii) the outside of the data centre. Preferably, the data centre is a data centre according to the first aspect of the invention. Optionally, the UPS switchboard is for directing electrical power to the racks of IT equipment supplied with cooling air. Additionally or alternatively, it may be that the UPS switchboard is for directing electrical power to racks of IT equipment different to the racks IT equipment supplied with cooling air by the air handling unit. Optionally, the second area is a service area. Optionally, the first area is a data hall.

Optionally, the second area comprises one or more fans for drawing cooling air through the second area, wherein the method comprises operating the one or more fans to (i) direct the second cool air stream to the second area, and (ii) mix the third warm air stream with cool air from or in the cooling air plenum. Optionally, the one or more fans includes at least one fan selected from (a) a fan integral to the UPS switchboard, and (b) a booster fan separate to the UPS switchboard. Optionally, the services area comprises an adjustable vent for controlling the amount of cooling air admitted into the second area, wherein the method comprises operating the adjustable vent to direct the second cool air stream to the second area.

Optionally, the data centre comprises a climate control system comprising a controller and at least one sensor, such as a temperature and/or humidity sensor. Preferably, the climate control system comprises at least one services area sensor for measuring the temperature and/or humidity of air in the second area. Preferably the climate control system comprises at least one mixed air stream sensor for measuring temperature and/or humidity of the fourth mixed air stream. Preferably, the climate control system comprises at least one aisle sensor for measuring at least one of (i) air pressure in a cold aisle, (ii) air pressure in a hot aisle, (iii) differential pressure between adjacent hot and cold aisles. Optionally, the method comprises operating the climate control system to automatically control operation of the air handling unit in response to measurements received from at least one of the mixed air stream pressure and the aisle sensor. For example, it may be that the climate control system automatically operates the air handling unit to adjust the temperature of cooling air produced by the air handling unit in response to measurements received from the mixed air stream sensor. Additionally or alternatively, it may be that the climate control system automatically operates the air handling unit to adjust the amount (in $m^3/s$) of cooling air produced by the air handling unit in response to measurements received from the aisle sensor. Optionally the climate control system automatically adjusts the amount (in $m^3/s$) of air forming the second cool air stream in response to measurements received from the second area sensor.

Preferably, the adjustable vent is adjustable at least between a closed position, a partially open position, and a fully open position. Preferably, the booster fan has a maximum normal operating speed. It will be appreciated that the maximum normal operating speed of the fan may not be the true maximum speed of the fan, but instead be the maximum permitted speed during normal operation of the data centre. Optionally, the method comprises operating the data centre (1) in a first mode in which the adjustable vent is partially open and in which the booster fan operates at a first speed, the first speed being below its maximum normal operating speed, (2) in a second mode in which the adjustable vent is fully open and the booster fan operates at the first speed, (3) in a third mode in which the adjustable vent is fully open and the booster fan operates its maximum normal operating speed. Optionally, the method comprises operating the climate control system to (a) automatically switch the data centre from the first mode to the second mode in response to the measured temperature and/or humidity in the second area exceeding a pre-programmed maximum temperature and/or humidity threshold, and (b) automatically switch the data centre from the second mode of operation to the third mode of operation in response to the measured temperature and/or humidity in the second area exceeding a pre-programmed maximum temperature and/or humidity threshold. Optionally, the method comprises operating the climate control system to (c) automatically switch the data centre from the third mode to the second mode in response to the measured temperature and/or humidity in the second area dropping below a pre-programmed minimum temperature and/or humidity threshold, and (d) automatically switch the data centre from the second mode of operation to the first mode of operation in response to the measured temperature and/or humidity in the second area dropping below a pre-programmed minimum temperature and/or humidity threshold.

Optionally, the services area comprises a partition separating the cold zone from the hot zone, the partition forming a fire barrier and comprising an opening for allowing air to pass from the cold zone to the hot zone. Optionally, the or each opening comprises a fire damper, the fire damper preferably comprising a plurality of damper blades movable between a first open position in which air is able to flow freely through the opening, and a second closed position in which air flow through the opening in inhibited. Optionally, the services area additionally comprises at least one airflow path leading from an air outlet of the at least one UPS switchboard to the opening in the partition. Preferably, the cold zone of the services area is in direct fluid communication with the airflow path. When the cold zone is in direct fluid communication with said airflow path, warm air from the UPS switchboard is able to flow into the cold zone of the services area when the fire damper is in the second closed position. Optionally, said airflow path is enclosed for at least part of its length. For example, the services area may comprise at least one duct at least partially enclosing said airflow path. Optionally, when the airflow path is enclosed for at least part of its length, direct fluid communication between the cold zone and said airflow path is provided by at least one opening along said airflow path. Optionally, the opening is in the form of a gap between the duct and the UPS switchboard, for example when the duct comprises an air inlet and the air inlet is spaced apart from the air outlet of the UPS switchboard. Additionally or alternatively, the duct comprises an opening providing said direct fluid communication. It may be that the opening comprises an adjustable vent movable between a first closed position in which the duct at least substantially encloses the airflow path and a second open position in which the opening provides direct fluid communication between said airflow path and the cold zone of the service area. It may be that one duct is provided for channeling air from a plurality of UPS switchboards. Additionally or alternatively, it may be that there is a plurality of ducts for channeling air. Preferably, each UPS switchboard is served by at least one duct. Preferably, the or each duct comprises an air intake aligned with and spaced apart from the air outlet of the UPS switchboard. The air intake is aligned with the air outlet so that the duct can readily receive air exiting the air outlet. For example, it may be that the air inlet is aligned in the flow direction of air exiting the air outlet; in other words, the air inlet is positioned in front of the air outlet so that air flowing out of the air outlet can flow straight into the air inlet. Optionally, the air inlet of the duct has a larger cross-section than the air outlet of the UPS switchboard. It will be appreciated that the air inlet of the duct is spaced apart from the air outlet of the UPS switchboard when the cold zone of the services area is in open fluid communication with the airflow path between the air outlet of the UPS switchboard and the air inlet of the duct. For example, it may be that there is a gap of 10-50 mm between the air inlet and the air outlet. It will be appreciated that there need not be a gap on all sides. For example, it may be that the gap is in the form of an opening on one or more sides, such as when a part of the duct is attached to the top of the UPS switchboard. Preferably the or each duct comprises an air exhaust connected to the opening of the partition, for example sealingly connected so that the duct and the opening cooperate to entrain the airflow. Preferably, the method comprises: operating the data centre in a first fire free mode in which the fire damper is maintained in an open position thereby allowing the duct to channel warm air from the UPS switchboard into the hot zone, switching data centre operation to a second fire detected mode, and, operating the data centre in the second fire detected mode in which the fire damper is maintained in a closed position thereby causing warm air from the UPS switchboard to pass through the gap between the air intake of the duct and the air outlet of the UPS switchboard into the cold zone. Preferably, the step of switching data centre operation comprises moving the fire damper from the open position to the closed position. When the duct comprises an opening having an adjustable vent, it may be that the step of switching data centre operation comprises moving the adjustable vent from its closed position to its open position. Optionally, the cold zone of the services area comprises an air inlet for allowing cooling air to enter the cold zone, the air inlet having an adjustable vent and being comprised in a door of a door assembly for controlling personnel access to the cold zone, wherein the door assembly additionally comprises a fire door. Preferably, when the data centre is operated in the first fire free mode, the fire door is maintained in an open position thereby allowing the adjustable vent to regulate flow of cooling air into the cold zone, and, when then data centre is operated in the fire detected mode, the fire door is maintained in a closed position thereby preventing flow of cooling air into the cold zone, wherein the step of switching data centre operation comprises moving the fire door from the open position to the closed position. Preferably, the data centre comprises a fire control system comprising a controller and a plurality of fire detection sensors, the controller being configured to receive signals from the sensors and to transmit signals to the fire damper and the fire door, if present, wherein the method comprises operating the fire control system so that the controller automatically initiates the step of switching data centre operation from the first fire free mode to the second fire detected mode when a signal is received from at least one sensor.

According to a fourth aspect, the present invention provides a data centre comprising a plurality of racks of IT equipment accommodated in a first area, at least one uninterruptible power supply (UPS) switchboard accommodated in a second area, the UPS switchboard being for directing electrical power to racks of IT equipment, and, an air handling unit for supplying cooling air, wherein the first area is configured to receive cooling air from the air handling unit, and the second area is configured to receive cooling air from the air handling unit. Optionally, the data centre comprises a cooling air plenum in a third area, wherein the first and second areas are configured to receive cooling air from the air handling unit via the cooling air plenum. Optionally, the cooling air plenum is configured to receive warm air from the second area. Optionally, the air handling unit is configured to receive warm air from the first area. Preferably, the first area is configured to receive a mixture of cooling air from the air handing unit and warm air from the second area. In use, the air handling unit supplies cooling air to the IT equipment via the cooling air plenum, wherein a portion of the cooling air travels to the first area via the second area. Optionally, the data centre comprises a booster fan for transporting warm air from the second area towards the first area, for example to the cooling air plenum. Optionally, the data centre comprises an adjustable vent controllable to regulate flow of the cooling air into the second area, such as an adjustable vent accommodated in a door providing personnel access to the second area.

According to a fifth aspect, the present invention provides a services area module for a data centre, wherein the services area module comprises a personnel area and a UPS switchboard storage area adjacent a wall, the wall extending along at least part of one side of the module, wherein the UPS switchboard storage area accommodates at least one UPS switchboard having a cooling air inlet and a warm air outlet, the cooling air inlet of the UPS switchboard being configured to receive cooling air from the personnel area, and wherein the wall includes an air inlet and an air outlet, the air inlet being configured to admit cooling air into the personnel area of the module and being sized to provide personnel access to the personnel area, and the air outlet being configured to exhaust warm air out of the module, and wherein the module additionally comprises a duct for directing air from the warm air outlet of the UPS switchboard to the air outlet in the wall. Optionally, the module comprises an electrical switchboard storage area accommodating at least one electrical switchboard. Preferably, the personnel area provides personnel access to the UPS switchboard storage area, and optionally to the electrical switchboard storage area. Optionally, the electrical switchboard storage area and the UPS switchboard storage area are spaced apart by at least part of the personnel area.

Optionally, the air inlet in the wall has a height of at least 2 m and a width of at least 1 m. Preferably, the air inlet comprises a door assembly comprising a first door having an adjustable vent for controlling airflow through the air inlet, wherein the door is configured to control personnel access to the personnel area of the services area. Optionally, the door assembly additionally comprises a fire door for preventing spread of fire and/or smoke through the air inlet in the event of a fire. Optionally, the air outlet in the wall comprises a fire damper for preventing the spread of fire and/or smoke through the air outlet in the event of a fire. Optionally, the wall includes a plurality of said air outlets. Optionally, the wall is a fire barrier for separating the services area from an adjacent area of the data centre when the module is in use. Optionally, the wall extends along the entire length of one side of the module. Optionally, the module is provided with walls on all sides. Optionally, the module comprises one or more additional doorways provided with corresponding door assemblies including a door (e.g. a non-vented door and/or a fire door). Optionally, the module is configured to be positioned within a building. For example, it may be that, in use, the module is supported on a floor in the building and enclosed within the building, e.g. without supporting any other part of the building. Additionally or alternatively, the module is configured to form an integral part of the structure of a data centre building. For example, it may be that the module is a structural module for integrating with and supporting one or more other structural sections of the data centre building.

Optionally the module has a length of 5 to 25 m, such as 10 to 20 m, for example 12 to 15 m. Optionally the module has a width of 2 to 8 m, such as 3 to 6 m, for example 3 to 4 m. Optionally, the module has a height of 2 to 5 m, such as 3 to 4 m. Preferably, the module is sized and configured to allow transport by road.

Preferably, the module is a module for forming at least the cold zone of a services area of a data centre according to the first aspect of the invention.

It will of course be appreciated that features described in relation to one aspect of the present invention may be incorporated into other aspects of the present invention. For example, a method of the invention may incorporate any of the features described with reference to an apparatus of the invention and vice versa.

DESCRIPTION OF THE DRAWINGS

Embodiments of the present invention will now be described by way of example only with reference to the accompanying schematic drawings of which:

FIG. 2*a* is a schematic view of a data centre according to another embodiment of the invention;

DETAILED DESCRIPTION

Figure 1:
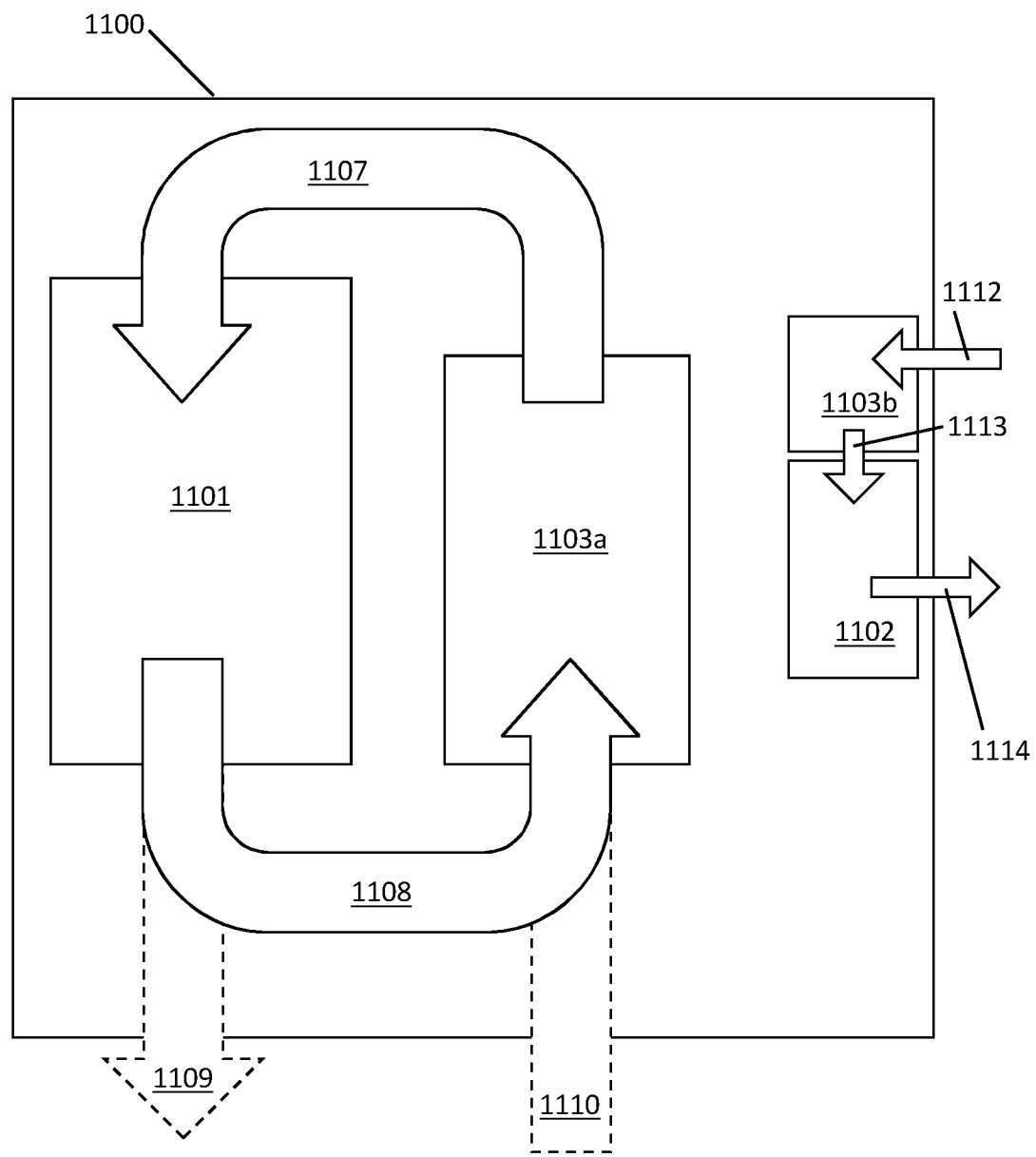
FIG. 1 is a schematic view of a data centre according to the prior art.

As used herein, the term 'in use' means during the normal use of the item so described. For example, a data centre is 'in use' when operating normally, for example when the items of IT equipment housed in the data centre are functioning, and the air handling unit is operating to provide adequate cooling air to the items of IT equipment. It will be appreciated that a data centre is operating normally whenever it is operating within its design thresholds. For example, when the data centre is operating at 20% of its maximum design capacity, or 100% of its maximum design capacity, it is operating normally.

A data centre is a facility for housing large numbers of densely packed computer servers. One approach classifying data centre size is by the total power consumption of the IT equipment in the data centre (when the data centre is at full IT equipment capacity). Small to medium-sized data centres may, for example, have a power consumption of 125 KW to 1.5 MW, large-scale data centres may have a power consumption of 10 MW to 50 MW (or, in some cases, above 100 MW). The power consumption of such large-scale data centres is comparable to the power requirements of a town of 7,000 to 35,000 households in the UK. The data centre of the present invention may be at least a 500 KW, such as at least a 1 MW, for example at least a 10 MW data centre.

As used herein, an electrical switchboard is a device for directing electricity from one or more sources of supply to one or more regions of usage; it is not a UPS switchboard. It is an assembly of one or more panels, each of which contains one or more switches that allow electricity to be redirected. Typically, switchgear is a combination of electrical disconnect switches, fuses or circuit breakers used to control, protect and isolate electrical equipment. A low voltage electrical switchboard (LVSB) is an electrical switchboard that is operated to direct low voltage electricity, defined by the International Electrotechnical Commission (IEC) as voltage in the range 50 to 1000 V AC or 120 to 1500 V DC. In electrical power systems, low voltage most commonly refers to the mains voltages as used by domestic and light industrial and commercial consumers. British Standard BS 7671:2008 defines supply system low voltage as: 50 to 1000 VAC or 120 to 1500 V ripple-free DC between conductors; 50 to 600 VAC or 120 to 900 V ripple-free DC between conductors and Earth. As used herein, an IT equipment electrical switchboard is an electrical switchboard used to direct electricity to IT equipment (i.e. computer servers) in the data centre, and a mechanical equipment electrical switchboard is an electrical switchboard used to direct electricity to non-IT equipment (including, e.g., cooling systems) in the data centre. As used herein, "'A' Supply" is a primary electrical circuit connecting an electrical switchboard to items of electrical equipment (including IT and mechanical equipment), and "'B' Supply" is a backup electrical circuit connecting the same electrical switchboard to the same items of electrical equipment.

As used herein, Uninterruptible Power Supply (UPS) system refers to electrical apparatus that provides emergency power to a load when the input power source or mains power fails. Typically, a UPS system differs from an auxiliary or emergency power system or standby generator in that it will provide near-instantaneous protection from input power interruptions, by supplying energy stored, e.g. in batteries. Often, the runtime of UPS power sources is relatively short (only a few minutes) but sufficient to start a standby power source or properly shut down the protected equipment. A UPS system may comprise a UPS switchboard and a UPS power source. Preferably, the UPS system is a static UPS system, for example wherein the UPS power source includes or consists of batteries and/or supercapacitors, preferably wherein batteries are the UPS power source. A UPS Switchboard is the electrical switchboard used for directing electricity between the UPS power source, electrical equipment (e.g. IT equipment and/or mechanical equipment) in the data centre, the main external power source (e.g. an external electric distribution network), and optionally the backup power source (e.g. on-site generators). Preferably, the UPS switchboard also functions as a rectifier for converting electrical current from alternating current to direct current (e.g. to supply power to batteries), and as an inverter for converting electrical current from direct current to alternating current (e.g. to receive power from batteries).

As used herein, a fire barrier is a fire-resistant construction used to prevent the spread of fire for a prescribed period of time. A fire barrier can be used to subdivide a building into separate fire areas, and is usually constructed in accordance with locally applicable building codes. A fire wall is a particular type of fire barrier, typically being a fire barrier that is structurally self-sufficient. A fire barrier may be continuous from an exterior wall to an exterior wall, or from a floor below to a floor or roof above, or from one fire barrier to another fire barrier. Fire barriers are often given a time rating, such as a '1 hour' rating, in terms of integrity and/or insulation. Integrity refers to the ability of the fire barrier to remain standing for the specified time. For example, a 1-hour integrity fire rating test may involve exposing one side of a free-standing sample of the barrier to flames for an hour, throughout which the barrier must prevent passage of flames from one side to the other. In some tests, the barrier is subsequently sprayed with water at the end of the 1-hour period to ensure that the integrity of the barrier is maintained under fire-fighting conditions. Additionally or alternatively, a 1-hour insulation fire rating test may involve exposing one side of a sample of the barrier to flames for an hour, throughout which the temperature on the other side of the barrier should not exceed a pre-defined set point. In the UK, fire ratings are often assessed using British Standard BS:476.

Fire dampers are fire protection products used in heating, ventilation, and air conditioning (HVAC) ducts to prevent the spread of fire through ductwork that passes through fire-barriers. Fire/smoke dampers are similar to fire dampers in fire resistance rating, and additionally prevent spread of smoke through ductwork. It will be appreciated that any fire damper described herein may additionally be a smoke damper. Fire dampers can be activated by integral thermal elements (e.g. which melt at pre-defined temperatures thereby allowing springs to close damper blades) and/or by a central fire control system (e.g. that sends a control signal to the damper to operate motorised damper blades). Such a fire control system may include detectors proximal to and/or remote from the damper, which can sense heat or smoke in the building.

As used herein, 'IT equipment' includes computer servers, especially rack-mountable servers. A typical server rack may be configured to accommodate 42 individual servers stacked vertically, and may have a width of 600 mm and a depth of 1070 mm. Other rack sizes are also available, for example racks able to accommodate 45, 48, 52 or 58 individual servers, with some racks being 750 mm or 800 mm wide and 1100 mm or 1200 mm deep. Rack heights are typically referred to in terms of 'rack units' or 'U', with one U having a height of 44.5 mm and typically being able to accommodate a single server.

A rack storage area is a space in the data centre provided for accommodating a plurality of racks, typically arranged in a row. Optionally, a single rack storage area may be configured to accommodate a row of at least 5 racks, such as at least 10 racks, for example at least 15 racks. Typically, each cold aisle is flanked on opposing sides by one or more rack storage areas. It will be appreciated that a single cold aisle may, for example, include two or more rack storage areas on each side with each rack storage area on each side being separated by a barrier such as a blanking panel. While a cold aisle may, in principle, be any length, it may be that a cold aisle has no more than 40, such as no more than 30, for example no more than 20 racks along its length on one (or each) side. It will be appreciated that, in use, each cold aisle may have 10 to 80, such as 20 to 60, for example 30 to 40 racks along its length. It will further be appreciated that the data centre may configured to accommodate IT equipment comprising at least 840, such as at least 1680, for example at least 2520 individual servers.

Figure 2A:
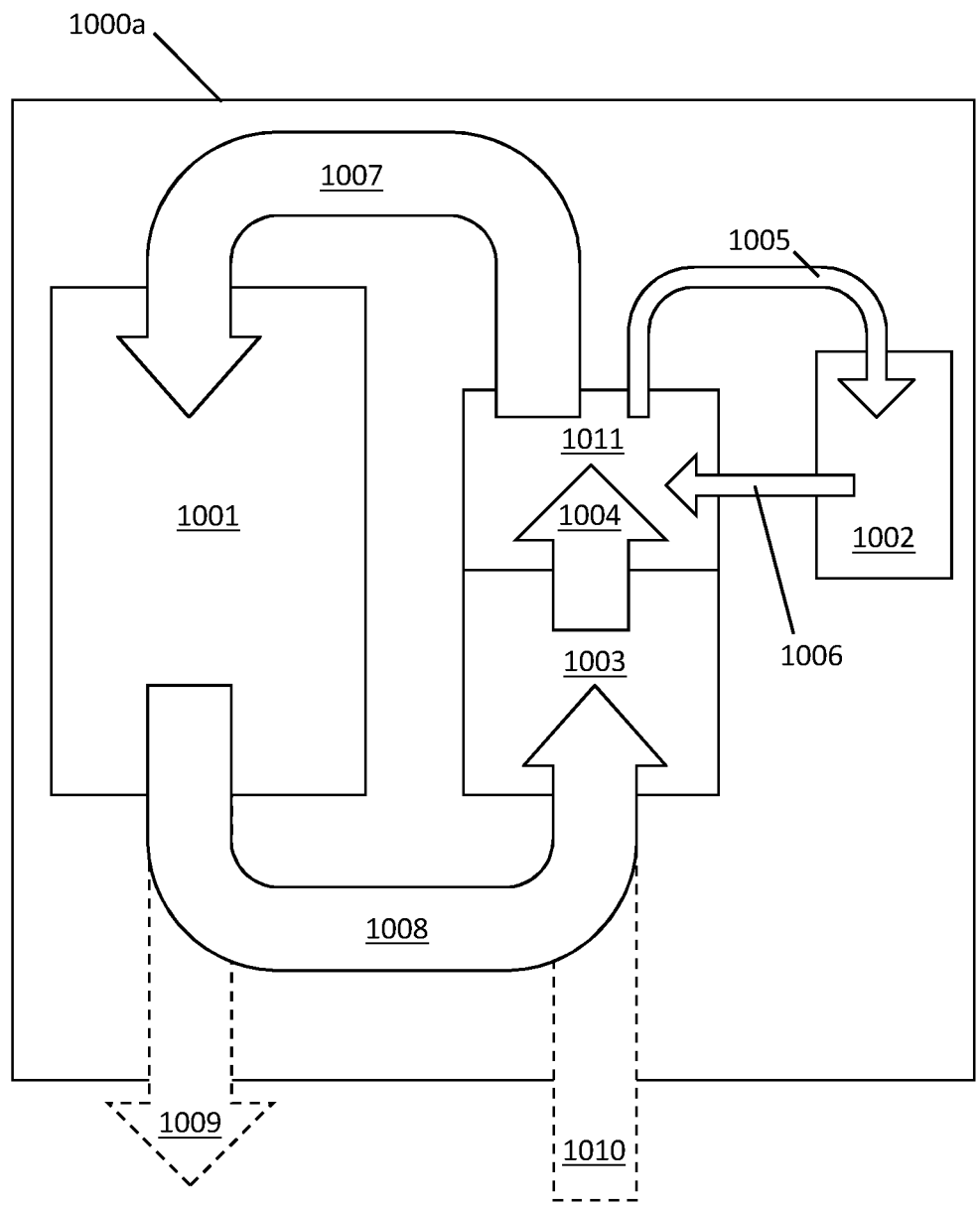
FIG. 2*a* is a schematic view of a data centre according to an embodiment of the invention.

A schematic representation of a data centre 1000a according to an embodiment of the invention is shown in FIG. 2a. The data centre 1000 is shown operating under a direct air cooling regime, but could alternatively be configured to operate under an indirect air cooling regime. The data centre 1000 comprises a first area 1001 accommodating a plurality of racks of IT equipment (not shown in FIG. 2), and a second area 1002 accommodating at least one UPS switchboard (not shown in FIG. 2) for directing electrical power to racks of IT equipment. The data centre 1000 further comprises an air handling unit 1003 for suppling cooling air. In use, the air handling unit 1003 supplies a first cool air stream 1004 into a cooling air plenum 1011. A portion of the cooling air in the cooling air plenum 1011 is directed as a second cool air stream 1005 to the second area 1002 to cool the UPS switchboard accommodated therein, thereby generating a third warm air stream 1006. The third warm air stream 1006 is returned to the cooling air plenum 1011, where it is mixed with cool air in the cooling air plenum 1011 to form a fourth mixed air stream 1007. The fourth mixed air stream 1007 is directed to the first area 1001 to cool the IT equipment accommodated therein, thereby generating a fifth warm air stream. It will be appreciated that the second cool air stream 1005 and the fourth mixed air stream effectively have substantially the same composition. The fifth warm air stream can be directed back to the air handling unit 1003 as a recirculated warm air stream 1008, and/or directed out of the data centre 1000 as an exhaust air stream 1009. Depending on whether, or how much, of the fifth warm air stream is directed out of the data centre 1000, the air handling unit 1003 is supplied with the recirculated warm air stream 1008 and/or an ambient intake air stream 1010 originating outside of the data centre 1000. It will be appreciated that the same schematic layout could apply to a data centre configured to utilise an indirect air cooling system simply by dispensing with the exhaust air stream 1009 and the intake air stream 1010. It will be appreciated that the 'splitting point' (i.e. the location at which the second cool air stream 1005 is extracted from air flowing from the air handling unit 1003 and first area 1001) is downstream of the 'mixing point' (i.e. the location at which the third warm air stream 1006 joins air flowing from the air handling unit 1003 to the first area 1001). It will be appreciated that the air handling unit 1003 and the cooling air plenum 1011 may optionally be comprised in a single air handling assembly.

Figure 2B:
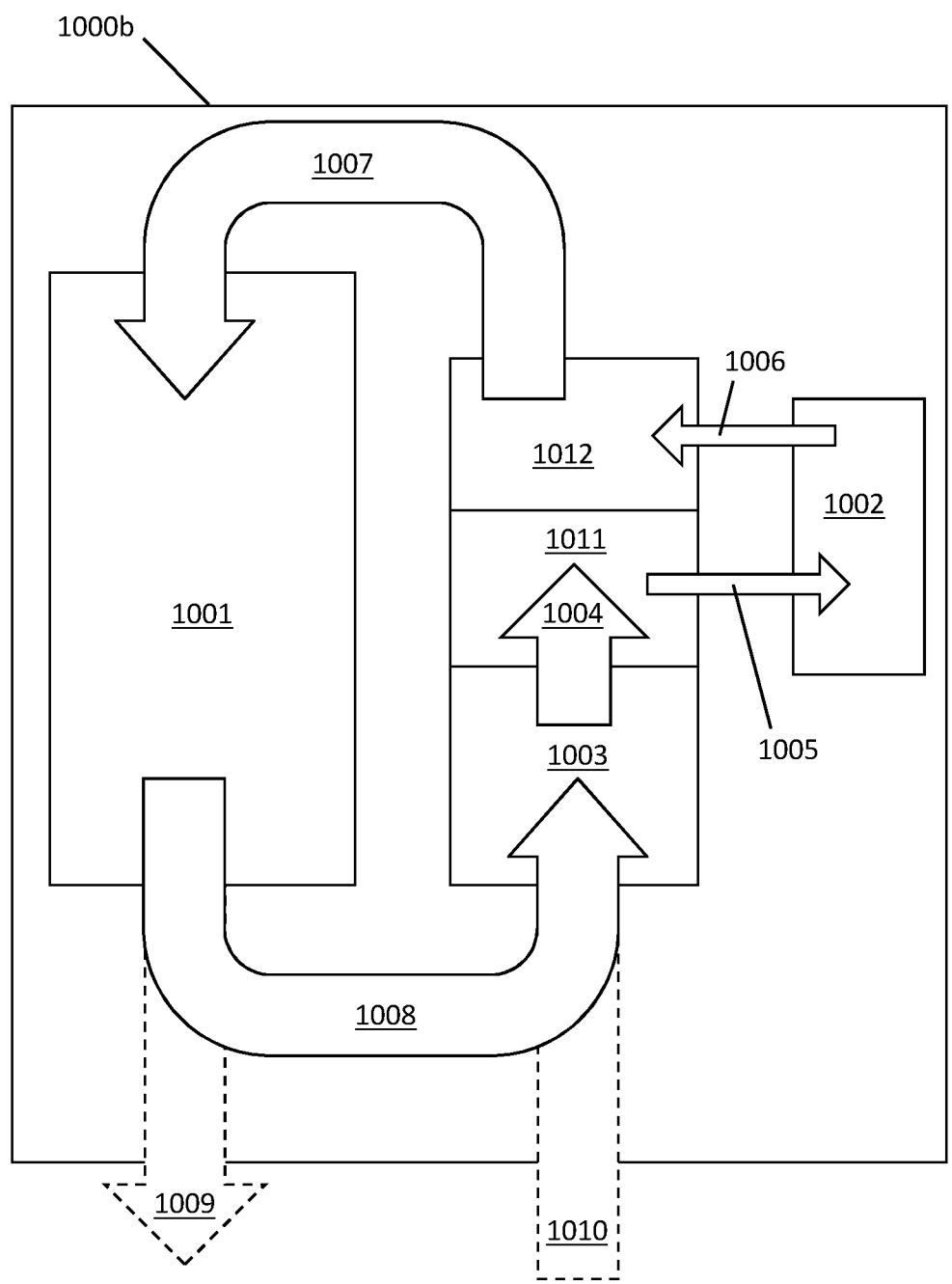

Another schematic representation of a data centre 1000b according to another embodiment of the invention is shown in FIG. 2b. The features of the data centre 1000b of FIG. 2b that are the same as those of the data centre 1000a of FIG. 2a are labelled with the same reference numerals as used in FIG. 2a. When the data centre 1000b of FIG. 2b is in use, the air handling unit 1003 supplies a first cool air stream 1004 into a cooling air plenum 1011. A portion of the cooling air from the cooling air plenum 1011 is directed as a second cool air stream 1005 to the second area 1002 to cool the UPS switchboard accommodated therein, thereby generating a third warm air stream 1006. The third warm air stream 1006 is then mixed with cool air from the cooling air plenum 1011 in a mixing chamber 1012 to form a fourth mixed air stream 1007. The fourth mixed air stream 1007 is directed to the first area 1001 to cool the IT equipment accommodated therein, thereby generating a fifth warm air stream. It will be appreciated that the second cool air stream 1005 and the fourth mixed air stream do not necessarily have substantially the same composition. It will also be appreciated that the 'splitting point' (i.e. the location at which the second cool air stream 1005 is extracted from air flowing from the air handling unit 1003 and first area 1001) is upstream of the 'mixing point' (i.e. the location at which the third warm air stream 1006 joins air flowing from the air handling unit 1003 to the first area 1001). It will be appreciated that the air handling unit 1003 and the cooling air plenum 1011, and optionally the mixing chamber 1012, may optionally be comprised in a single air handling assembly.

It will be appreciated that, as compared to the prior art arrangement shown in FIG. 1, the inventive embodiments of FIGS. 2a and 2b are able to utilise a single air handling unit 1003, thus reducing the number of separate items of equipment requiring servicing and maintenance. Furthermore, it is typically the case that the power consumption of one large air handling unit is lower than two smaller air handling units when providing the same cooling capacity.

For the embodiments of FIGS. 2a and 2b, during peak operation (meaning that the IT equipment in the first area 1001 and the UPS switchboard(s) in the second area 1002 are operating at their maximum design load and thus require their maximum design cooling):

the air handling unit 1003 supplies cooling air 1004 to the mixing chamber 1011 in an amount of about 50 m$^3$/s at a temperature of about 23° C.;

the second cool air stream 1005 supplies about 10 m$^3$/s of air to the second area 1002;

the third warm air stream 1006 supplies about 10 m$^3$/s of air to the cooling air plenum 1011/mixing chamber 1012; and, the fourth mixed air stream 1007 supplies about 50 m$^3$/s of air to the first area 1001.

In the embodiment of FIG. 2a, the air of the second cool air stream 1005 has a temperature of about 24° C., the air of the third warm air stream has a temperature of about 30° C., and the air of the fourth mixed air stream has a temperature of about 24° C. In the embodiment of FIG. 2b, the air of the second cool air stream 1005 has a temperature of about 23° C., the air of the third warm air stream has a temperature of about 30° C., and the air of the fourth mixed air stream has a temperature of about 24° C. It may be that, in a like for like comparison, the amount of air supplied to the second area by the second cool air stream in the embodiment of FIG. 2a is slightly higher than in the embodiment of FIG. 2b.

If, rather than returning the third warm air stream 1006 to the mixing chamber 1011, the warm air stream 1006 was combined with the fifth warm air stream 1008 and returned to the air handling unit 1003, the air handling unit 1003 would be required to produce 60 m$^3$/s of cooling air to match the same cooling requirements. Supplying cooling air at a higher rate not only requires additional air moving capacity (e.g. in the form of fans), but also requires additional capacity in all components of the air handling unit. For example, each cooling component of the air handling unit (including, e.g., an evaporative cooling device such as a wetted matrix and/or a mechanical cooling device such as a DX cooler) typically has a velocity at which it can adequately cool air it is contacted with. To produce an increased volume of air per second, typically the size of the cooling equipment (e.g. the cross-sectional area of a wetted matrix and/or the number of DX cooling coils) would need to be increased. In contrast, providing cooling air at a temperature 1° C. lower than that required for cooling the IT equipment is typically well within the capacity of the air handling unit.

Figure 3:
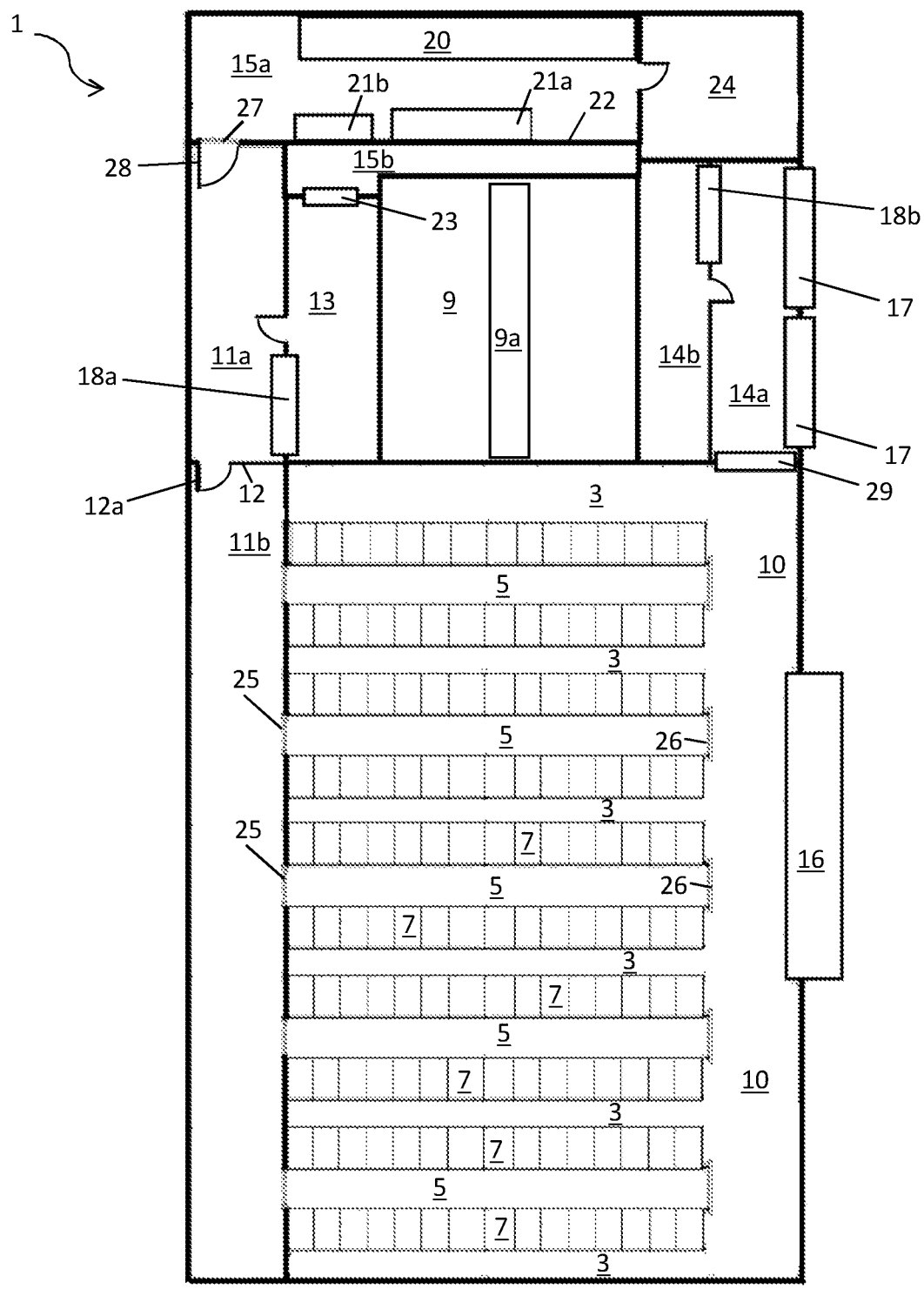
FIG. 3 is a plan view of a data centre according to another embodiment of the invention.
Figure 4:
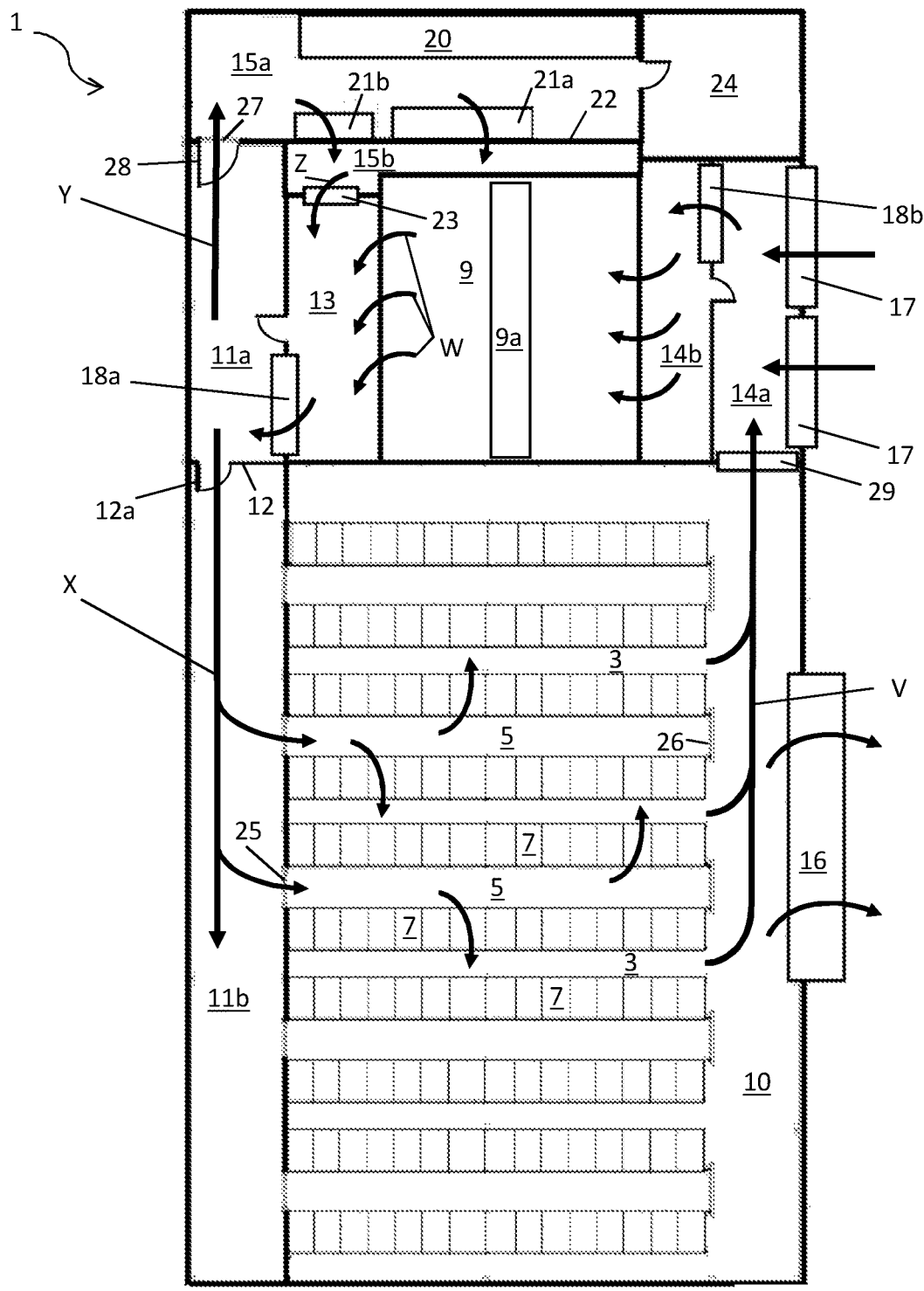
FIG. 4 is a plan view of the data centre of FIG. 3 with arrows added to show air flow through the data centre.

A data centre 1 according to another embodiment of the invention is shown in FIG. 3. The data centre 1 uses a direct free air cooling regime. (A "free air cooling" regime is understood by the person skilled in the art as a regime which makes use of ambient air outside the data centre to provide a significant amount of cooling air inside the data centre for a significant proportion of the time during a typical year of operation of the data centre.) The data centre 1 of FIG. 3 is shown in FIG. 4 with arrows added to indicate the flow of air through the data centre 1. The data centre contains a plurality of hot aisles 3 interleaved with a plurality of cold aisles 5 wherein each hot aisle 3 is separated from an adjacent cold aisle 5 by a rack storage area 7. Each rack storage area 7 accommodates a row of fifteen racks of IT equipment, each rack holding forty two computer servers stacked one above the other. Cooling air is provided to the cold aisles 5 by an air handling unit 9 which outputs cooling air into an air mixing chamber 13 (indicated by the arrows labelled W in FIG. 4). The air handling unit 9 comprises a bank of fans 9a for moving air through the air handling unit 9 and to the cold aisles 5. Air from the mixing chamber 13 flows into an air supply corridor 11 through air blender 18a. The air blender 18a consists of an opening fitted with a plurality of angled baffles that passively increase the turbulence of air flowing through the blender, thereby increasing mixing. From the air mixing chamber 13, the cooling air follows a cooling air flow path, indicated by the arrow labelled 'X', from the air handling unit 9, through an air supply corridor 11, and into the cold aisles 5 through vented doors 25. The end of each cold aisle 5, at the end opposite the vented door 25, is blocked by a partition 26, so as to entrain cooling air through the racks in the rack storage areas 7. The air supply corridor 11a is divided into a first zone 11a and a second zone 11b, the zones separated by a cage wall 12 and door 12a to control personnel access along the air supply corridor 11. Air is able to flow freely through the cage wall 12 and door 12a whether the door is open or closed (the door 12a is shown in the open position in FIGS. 3 and 4).

The cooling air passes from the cold aisles 5 to the hot aisles 3 through the rack storage areas 7, and thus through the racks of IT equipment, thereby cooling the IT equipment. The warm air exhausted from the rack storage areas 7 into the hot aisles 3 then follows the airflow path labelled 'V' into a warm air return corridor 10. Depending on the temperature of air outside the data centre, at least some of the warm air flows from warm air return corridor 10 into warm air mixing chamber 14 via return vent 29, and/or at least some of the warm air flows out of the data centre through exhaust vents 16. Return vent 29 and exhaust vents 16 comprise adjustable dampers for controlling the amount of air from the warm air return corridor 10 that is (a) exhausted out of the data centre, or (b) recirculated into the mixing chamber 14. Also depending on the temperature of air outside the data centre, ambient air from outside the data centre enters mixing chamber 14 through intake vents 17. Intake vents 17 comprise adjustable dampers for controlling the amount of ambient air admitted into the mixing chamber 14. Also depending on the temperature of air outside the data centre, the air handling unit 9 receives air from the mixing chamber being in the form of one of (a) ambient air from outside the data centre, (b) warm air from the hot aisles 3, or (c) ambient air from outside the data centre mixed with warm air from the hot aisles 3. Warm air mixing chamber 14 comprises outer chamber 14a and inner chamber 14b. In use, air flows from the outer chamber 14a to the inner chamber 14b through air blender 18b. In the embodiment of FIG. 3, the air handling unit 900 may optionally be comprised in an air handling assembly, the air handling assembly also comprising the mixing chamber 13. Sound attenuation panels (not shown in FIG. 7) may optionally be provided adjacent or in the mixing chamber. For example, the air handling assembly may accommodate a plurality of panels arranged to absorb sound generated by the fans of the fan bank 9a. Optionally, the air handling assembly is provided as one or more modules.

As indicated in the Figures, the air supply corridor 11 is also configured to transport cooling air to a services area 15 via vented door 27. Vented door 27 is part of a door assembly that also comprises a fire door 28 (shown in its normal open position in FIGS. 3 and 4). Services area 15 comprises a central personnel area located in a cold zone 15a. The personnel area is flanked on one side by an electrical switchboard storage area accommodating IT and mechanical electrical switchboards 20, and a UPS switchboard storage area accommodating IT UPS switchboard 21a and mechanical UPS switchboard 21b. The UPS switchboards 21 are floor standing units positioned adjacent a partition 22 that separates the cold zone 15a of the services area from a hot zone 15b. The hot zone 15b of the services area 15 comprises a booster fan 23 for expelling warm air in the hot zone 15b into the mixing chamber 13. In use, cooling air flows from the air supply corridor 11 into the cold zone 15a of the services area 15, through the UPS switchboards 21 into the hot zone 15b (via ducts provided for each switchboard and via an opening in the partition 22, not shown in FIGS. 3 and 4), and from the hot zone 15b back into the mixing chamber 13. The warm air from the hot zone 15b of the services area 15 is then mixed with cool air from the air handling unit 9, and returns to the air supply corridor 11 through the air blender 18a. The UPS power source connected to the UPS switchboard consists of a plurality of batteries housed in battery room 24. In FIGS. 3 and 4, the door between the services area 15 and the battery room 24 is shown in an open position. Normally, this door would be kept closed. The battery room 24 is provided with its own, independent, air conditioning system (not shown). It has been found that batteries must be kept at a strictly controlled temperature; a temperature that is often different to the temperatures suitable for safe and reliable operation of UPS switchboards and rack-mounted IT equipment. Accordingly, it is often advantageous to provide the battery room 24 with its own air conditioning equipment.

Figure 5:
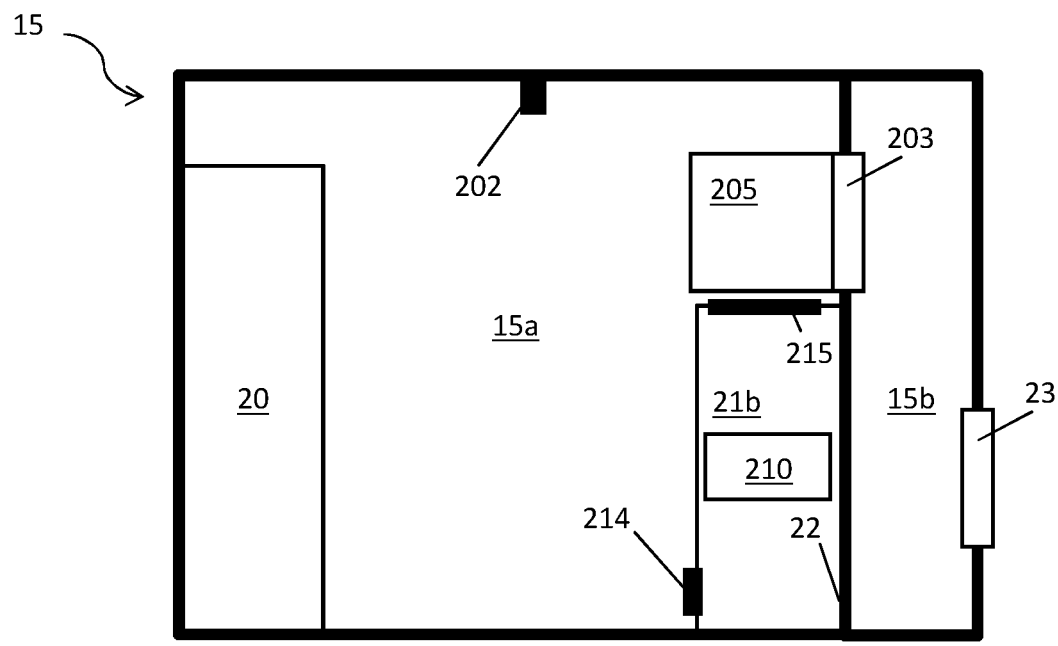
FIG. 5 is a cross-sectional view of the services area of the data centre of FIG. 3.
Figure 6:
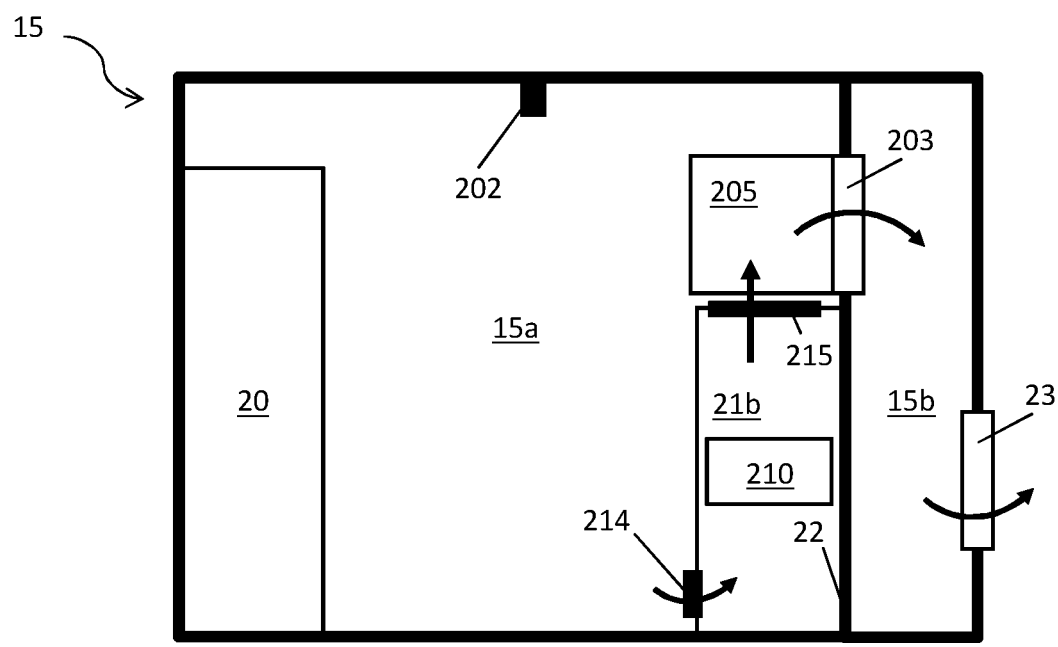
FIG. 6 is a cross-sectional view of the services area of the data centre of FIG. 3 with arrows added to show air flow through the services area.

FIG. 5 is a cross-sectional view of the services area 15 of the data centre of FIG. 3. FIG. 6 shows the cross-sectional view of FIG. 6 with arrows added to indicate the flow of air through the services area 15. The section of FIG. 5 shows the cold zone 15a of the services area 15 including the personnel area flanked on one side by the electrical switchboard 20 and on the other side by the mechanical UPS switchboard 21b. The mechanical UPS switchboard 21b is located adjacent partition 22 that separates the cold zone of the services area 15 from the hot zone 15b. The mechanical UPS switchboard 21b comprises a cooling air inlet 214, a warm air outlet 215, and an integral fan 210 for moving air through the UPS switchboard from the inlet 214 to the outlet 215. Aligned directly above the warm air outlet 215 and spaced apart from the mechanical switchboard 21b is a duct 205 for directing warm air from the outlet 215 to an adjustable vent 203 provided in an opening in the partition 22. The gap between the warm air outlet 215 of the UPS switchboard 21b and the duct 205 is about 2 cm. The adjustable vent 203 comprises a fire and smoke damper. The booster fan 23 associated with the hot zone 15b expels air from the hot zone 15b into the mixing chamber (not shown in FIGS. 5 and 6). The services area 15 also comprises a temperature and humidity sensor 202 located on the ceiling of the cold zone 15a. The sensor 202 is connected to a data centre climate control system (not shown). If the climate control system determines that the temperature in the cold zone 15a exceeds a pre-determined set point, first the vented door 27 (not shown in FIG. 5) is adjusted to open its vents to the greatest extent, and if those vents are already open, the speed of the booster fan 23 is increased. Typically, adjustable vent 203 is used only as a fire and smoke damper, and so remains in its fully open position except when smoke and/or fire is detected by the fire control system, when it would normally move to its fully closed position in response to a control signal received from the fire control system.

Cooling of the UPS switchboards will now be described with reference to FIGS. 3 to 6 of the drawings. Cooling air provided by the air handling unit 9, indicated by the arrows labelled W, follows a cooling air flow path Y into the services area cold zone 15a via mixing chamber 13 and air supply corridor 11. The cooling air is channeled via the air inlets 214 into the UPS switchboard 21, thereby cooling the UPS switchboard. Warm air is then exhausted from the UPS switchboard 21 through outlet 215, and immediately enters duct 205 which channels it through adjustable vent 203 into the hot zone 15b. The warm air then follows the air flow path labelled Z through the booster fan 23 into the air mixing chamber 13, downstream of the air handling unit 9, wherein the warm air exhausted from the services area 15 is mixed with the cold air being produced by air handling unit 9. The mixed warm and cold air is then exhausted from the air mixing chamber 13 as cooling air, via an air blender 18a provided in an opening between the mixing chamber 13 and air supply corridor 11, the cooling air then follows the cooling air flow paths X and Y into the cold aisles 5 and services area 15 respectively.

Typically, the cooling air is moved through the cold zone 15a substantially under the control of fans integral to the UPS switchboards with modulation of air flow by the vented door 27. Should excessive air temperature be detected in the cold zone 15a, movement of air through the cold zone 15a is substantially controlled instead by the booster fan 23.

In the event of fire being detected in either the services area or the IT area of the data centre, the fire control system automatically sends a signal to the adjustable vent 203, causing the fins inside to move to the closed position, thereby preventing airflow between the cold zone 15a and the hot zone 15b of the services area 15. It will be appreciated that this prevents the channeling of warm exhaust air from the UPS switchboard 21 out of the cold zone 15a. At the same time, the fire control system automatically sends a signal to the fire door 28, causing it to move to the closed position. Once the adjustable vent(s) and the fire door have closed, air in the services area is isolated from air in another part of the data centre, preventing smoke travelling throughout the data centre. The gap between the duct 205 and the top of the UPS switchboard allows arm air exiting the UPS switchboard to flow back into the cold zone 15a of the services area 15. While returning air into the cold zone 15a will result in an increase in air temperature in the cold zone 15a, in many circumstances the temperature increase is relatively slow, thus allowing continued operation of the UPS switchboard without overheating. For example, it may be that the UPS switchboard is able to continue operating for enough time to allow a controlled shut-down of equipment in the services area 15 and start-up of backup equipment elsewhere (e.g. in another services area). It will be appreciated that in all embodiments, the duct is spaced apart from the exhaust vent of the UPS switchboard by a gap small enough to allow the duct to direct a sufficient amount of exhaust air out of the cold zone when the adjustable vent is open, while being large enough to allow all exhaust air to return to the cold zone when the adjustable vent is closed.

Figure 7:
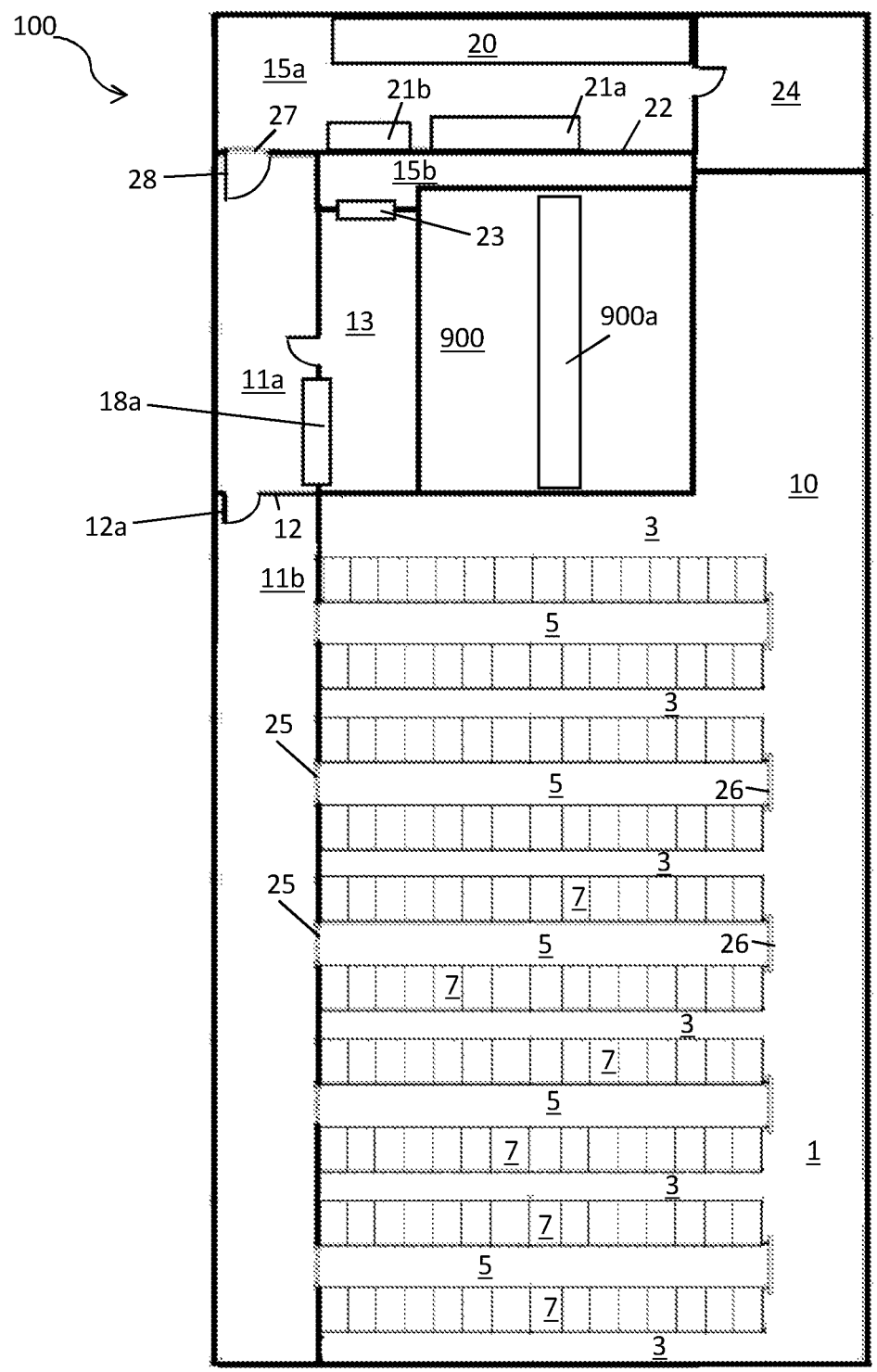
FIG. 7 is a plan view of a data centre according to another embodiment of the invention.
Figure 8:
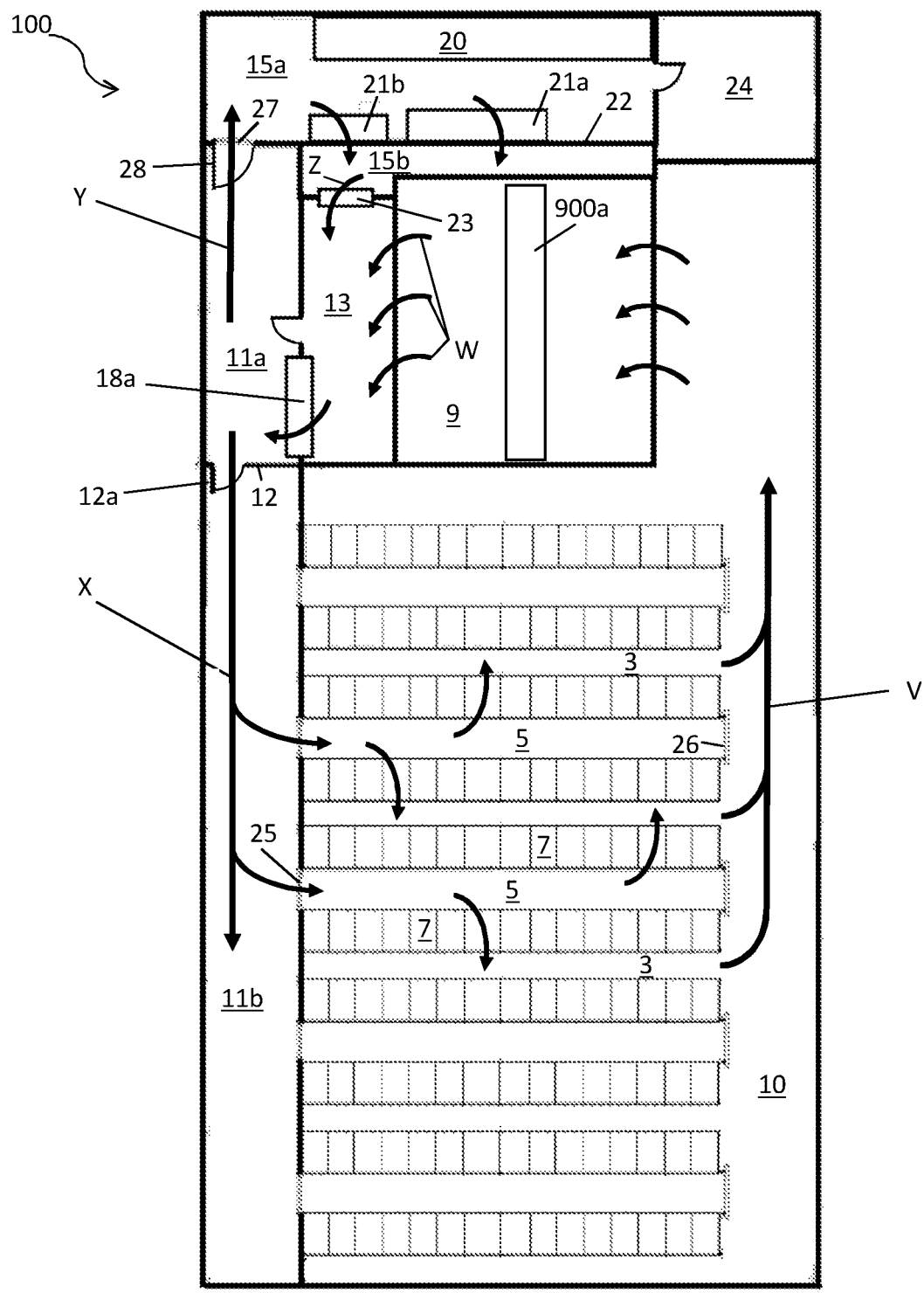
FIG. 8 is a plan view of the data centre of FIG. 6 with arrows added to show air flow through the data centre.

A data centre 100 according to another embodiment of the invention is shown in FIG. 7. The data centre 100 uses an indirect free air cooling regime. The data centre 100 of FIG. 7 is shown in FIG. 6 with arrows added to indicate the flow of air through the data centre 100. The features of the data centre 100 that are the same as those of the data centre 1 of FIGS. 3 and 4 as labelled with the same reference numerals as used in FIGS. 3 and 4. The data centre 100 comprises an indirect air handling unit 900 having segregated internal and external air flow paths. The air handling unit 900 comprises a bank of fans 900a for moving air through the air handling unit 900 and to the cold aisles 5. The internal air flow path is configured to provide cooling air to the services area 15 and the cold aisles 5, and to receive warm air from the hot aisles 3. The air handling unit 900 also comprises an external air flow path for receiving ambient air from outside the data centre (not shown). In use, the indirect air handling unit cools the air in the data centre by exchanging its heat with air flowing along the external air flow path. In the data centre 100 of FIGS. 7 and 8, all warm air from the hot aisles 5 is returned to the internal air flow path of the air handling unit 900. The cooling of the UPS switchboards is otherwise as described with reference to FIGS. 3 to 6 of the drawings. In the embodiment of FIG. 7, the air handling unit 900 may optionally be comprised in an air handling assembly, the air handling assembly also comprising the mixing chamber 13. Sound attenuation panels (not shown in FIG. 7) may optionally be provided adjacent the mixing chamber. For example, the air handling assembly may accommodate a plurality of panels arranged to absorb sound generated by the fans of the fan bank 900a. Optionally, the air handling assembly is provided as one or more modules.

Figure 9:
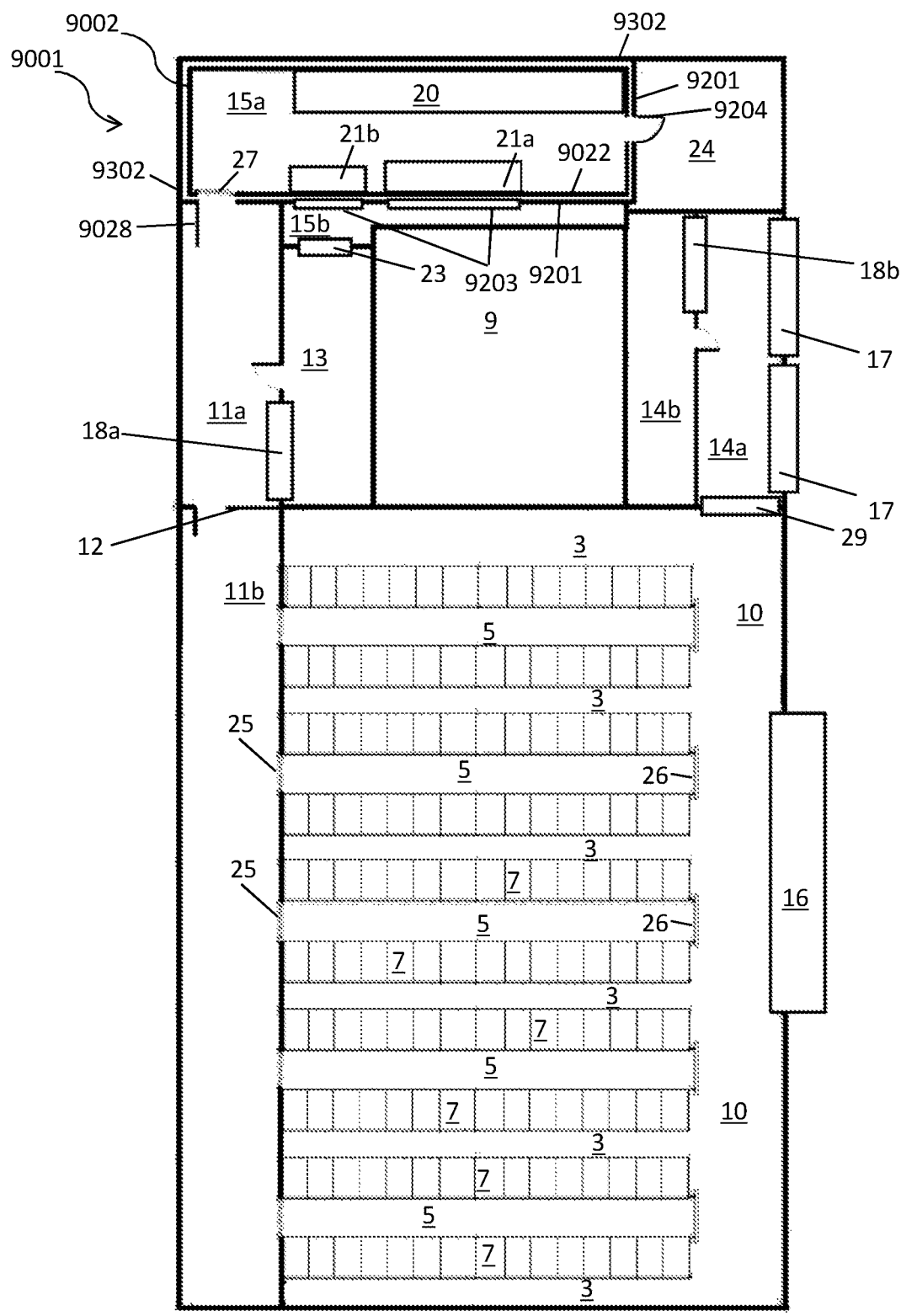
FIG. 9 is a plan view of another data centre according to another embodiment of the invention.

A data centre 9001 according to another embodiment of the invention is shown in FIG. 9. The features of the data centre 9001 that are the same as those of the data centre 1 of FIGS. 3 and 4 as labelled with the same reference numerals as used in FIGS. 3 and 4. The cold zone 15a of the services area is defined by a services module 9002 having a frame 9022 extending around the sides of the module 9002. The UPS switchboards 21 are floor standing units positioned adjacent the frame 9022. On the opposite side of the frame 9022 is a partition 9201. In this embodiment, the partition 9201 forms a fire barrier. The partition 9201 separates the cold zone 15a of the services area from a hot zone 15b. The partition 9201 also separates the cold zone 15a from the battery room 24. The services module 9002 was fitted with the UPS switchboards 21 and the electrical switchboards 20 as well as the vented door 27 at a manufacturing location, and then transported to the data centre site. The services module 9002 was then positioned in the building intended to provide the data centre 9001 and its frame 9022 attached to the floor (not shown in FIG. 9) of the building The partition 9201 comprises a frame fitted with a plurality of panels, and also includes fire dampers 9203 for allowing air to pass from the cold zone 15a of the services area to the hot zone 15b. The fire dampers 9203 comprise a plurality of motorised fins mounted in a frame (not shown in FIG. 9). During normal operation of the data centre, the fins are kept in an open position allowing air to flow through the damper. In the event of a fire, the fins move to a closed position that prevents airflow through the damper in response to a signal received from a data centre fire control system (not shown in FIG. 9). The partition 9201 further comprises a fire door 9028, which also moves to a closed position that prevents airflow through the vented door 27 in response to a signal received from the fire control system. Yet further, the partition 9201 comprises another fire door 9204 for allowing personnel access from the cold zone 15a of the services area to the battery room 24. Unlike the other fire door 9028, this fire door 9204 is normally kept in the closed position (although it is shown in its open position in FIG. 9) to allow the air conditioning unit for the battery room 24 to maintain its climate independently of the climate in the cold zone 15a of the services area.

Figure 10:
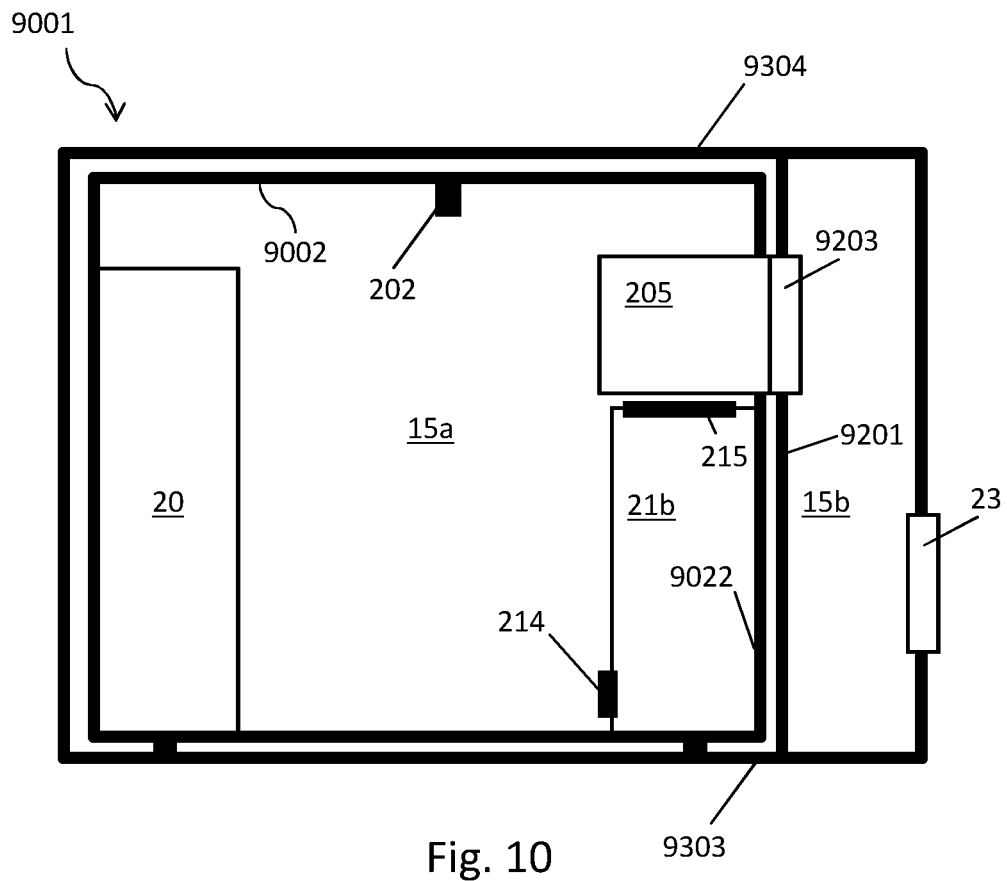
FIG. 10 is a cross-sectional view of the services area of the data centre of FIG. 9; and, FIG. 11 is a plan view of a services module for use in the date centre of FIG. 9.

FIG. 10 is a cross-sectional view of the services area 15 of the services module 9002 shown in FIG. 9. The same reference numerals used in FIGS. 5 and 9 are used in FIG. 10. As shown in FIG. 10, the cold zone 15a of the services area 15 is made up of a personnel area flanked on each side by the electrical switchboard 20 and the mechanical UPS switchboard 21b. The mechanical UPS switchboard 21b is located adjacent the first side of the frame 9022 of the services module 9002. As shown in FIG. 10, the services module 9002 is positioned between a floor 9303 and a ceiling 9304 of the building forming the data centre 9001. The services module 9002 is attached to the floor 9303 of the building.

Figure 11:
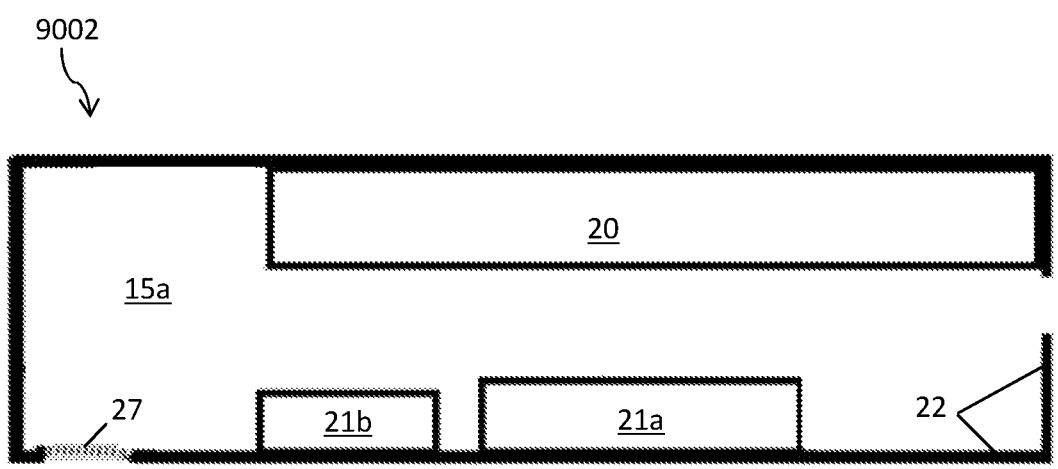

FIG. 11 shows a plan view of the services module 9002 of the data centre 9001 of FIG. 9. The same reference numerals as used in FIG. 9 are used in FIG. 11. FIG. 11 shows the services module 9002 as transported from its manufacturing location to the building forming the data centre 9001.

While the present invention has been described and illustrated with reference to particular embodiments, it will be appreciated by those of ordinary skill in the art that the invention lends itself to many different variations not specifically illustrated herein. The control of mixing of air within the data centre may depend indirectly on the temperature of air outside the data centre.

Where in the foregoing description, integers or elements are mentioned which have known, obvious or foreseeable equivalents, then such equivalents are herein incorporated as if individually set forth. Reference should be made to the claims for determining the true scope of the present invention, which should be construed so as to encompass any such equivalents. It will also be appreciated by the reader that integers or features of the invention that are described as preferable, advantageous, convenient or the like are optional and do not limit the scope of the independent claims. Moreover, it is to be understood that such optional integers or features, whilst of possible benefit in some embodiments of the invention, may not be desirable, and may therefore be absent, in other embodiments.

The invention claimed is:

1. A data centre for accommodating a plurality of racks of IT equipment, the data centre comprising:
   a. a plurality of hot aisles interleaved with a plurality of cold aisles, wherein each hot aisle is separated from an adjacent cold aisle by a rack storage area, each rack storage area being arranged to accommodate a row of racks of IT equipment; and
   b. an air handling unit configured to supply cooling air to the rack storage areas via the cold aisles;
   wherein, the data centre additionally comprises:
   c. a services area for accommodating at least one uninterruptible power supply (UPS) switchboard for directing electrical power to a plurality of racks of IT equipment, the services area comprising at least one hot zone and at least one cold zone, the at least one hot zone being separated from the at least one cold zone by at least one of (i) a UPS switchboard storage area and (ii) a partition, the UPS switchboard storage area being configured to accommodate at least one UPS switchboard;
   wherein, in use, cooling air is supplied to the UPS switchboard storage area from the air handling unit via the cold zone of the services area;
   and wherein, the data centre additionally comprises a cooling air supply space for transporting cooling air from the air handling unit and to:
   i) the plurality of cold aisles, and
   ii) the cold zone of the services area,
   the cooling air supply space being configured to receive air from:
   i) the air handling unit, and
   ii) the hot zone of the services area.

2. A data centre according to claim 1, wherein the air handling unit comprises a controllable air circulation system configured to circulate air from the air handling unit to the rack storage areas, the controllable air circulation system comprising at least one fan.

3. A data centre according to claim 1, wherein the cooling air supply space comprises an air supply corridor, the air supply corridor providing personnel access to at least one of i) the plurality of cold aisles, and ii) the cold zone of the services area.

4. A data centre according to claim 1, wherein the cooling air supply space comprises an air mixing chamber configured to receive air from the air handling unit and to receive air from the hot zone of the services area, optionally wherein the mixing chamber provides personnel access to the hot zone of the services area.

5. A data centre according to claim 1, configured so that a portion of the cooling air supplied to the rack storage areas from the air handling unit travels from the air handling unit to the rack storage areas via the services area.

6. A data centre according to claim 1, wherein the cold zone of the services area comprises an adjustable vent controllable to regulate airflow into the cold zone of the services area, optionally wherein the adjustable vent is comprised in a door of a door assembly for controlling personnel access to the cold zone.

7. A data centre according to claim 6, wherein the adjustable vent is comprised in a door of a door assembly for controlling personnel access to the cold zone, wherein the door assembly additionally comprises a fire door, the fire door having a first, open position in which personnel access to the cold zone is controlled by the door comprising the adjustable vent, and a second, closed position in which the fire door provides a fire barrier across the door assembly.

8. A data centre according to claim 1, wherein the services area comprises a partition separating the cold zone from the hot zone, and wherein the partition is in the form of a fire barrier, optionally wherein the partition comprises one or more openings for allowing air to pass from the cold zone to the hot zone, each opening comprising a fire damper.

9. A data centre according to claim 1, wherein the UPS storage area accommodates at least one UPS switchboard having an air inlet, an air outlet, and at least one integral fan for circulating air through the UPS switchboard from the air inlet to the air outlet, the air inlet being configured to receive air from the cold zone of the services area, optionally wherein data centre is configured so that the hot zone of the services area receives air from the air outlet of the UPS switchboard.

10. A data centre according to claim 9, configured so that, in a first mode of operation, air is circulated from the cold zone of the services area to the hot zone of the services area via the UPS switchboard substantially under the control of the at least one integral fan of the UPS switchboard.

11. A data centre according to claim 9, wherein the services area comprises one or more ducts for channeling air from the air outlet of the UPS switchboard to the hot zone, optionally wherein the one or more ducts comprises an air intake aligned with and spaced apart from the air outlet of the UPS switchboard.

12. A data centre according to claim 11, wherein the services area comprises a partition separating the cold and hot zones, and wherein the one or more ducts comprise one or more exhausts for exhausting air to the hot zone, wherein each exhaust is connected to an opening in the partition, optionally wherein the partition is in the form of a fire barrier and the opening comprises a fire damper.

13. A data centre according to claim 1, wherein the data centre comprises at least one controllable booster fan for expelling air from the hot zone of the services area, optionally into a mixing chamber.

14. A method of cooling electrical equipment in a data centre, wherein the data centre comprises:
   a plurality of hot aisles interleaved with a plurality of cold aisles, wherein each hot aisle is separated from an adjacent cold aisle by a row of IT equipment racks;
   an air handling unit;
   a services area accommodating at least one uninterruptible power supply (UPS) switchboard for directing electrical power a plurality of IT equipment racks, the services area comprising at least one cold zone and at least one hot zone separated from the at least one cold zone;
   a cooling air supply space;
   and wherein the method comprises:

cooling IT equipment in the IT equipment racks by supplying cooling air from the air handling unit via the cold aisles, such air then passing via the hot aisles, cooling the at least one UPS switchboard by supplying cooling air from the air handling unit via the at least one cold zone of the services area, such air then passing via the at least one hot zone of the services area, supplying via the cooling air supply space cooling air from the air handling unit to:
i) the IT equipment in the IT equipment racks, and
ii) the UPS switchboard,
and supplying to the cooling air supply space:
i) cooling air from the air handling unit, and
ii) warm air from the UPS switchboard.

15. A method according to claim 14, wherein the air handling unit comprises a controllable air circulation system comprising at least one fan;
and wherein the method comprises:
operating the controllable air circulation system to circulate air from the air handling unit to the IT equipment in the IT equipment racks.

16. A method according to claim 14, wherein the step of supplying via the cooling air supply space cooling air from the air handling unit to the IT equipment in the IT equipment racks comprises transporting a portion of the air so supplied via the UPS switchboard.

17. A method according to claim 14, wherein the data centre comprises a climate control system comprising a controller and a plurality of sensors, wherein the method comprises operating the climate control system to automatically control operation of the air handling unit.

18. A method according to claim 17, wherein the cold zone of the services area comprises an air inlet having an adjustable vent, optionally an inlet comprised in a door of a door assembly for controlling personnel access to the cold zone, wherein the method comprises operating the climate control system to automatically control the adjustable vent to regulate airflow into the cold zone of the services area.

19. A method according to claim 17, wherein the data centre comprises at least one controllable booster fan for transporting air out of the hot zone of the services area; wherein the method comprises operating the climate control system to automatically control operation of the booster fan.

20. A method according to claim 19, comprising controlling the booster fan in dependence on temperature and/or humidity measurements made by a temperature and/or humidity sensor located in the cold zones of the services area.

21. A method according to claim 19, wherein the UPS switchboard comprises at least one temperature sensor for measuring the temperature of at least part of the UPS switchboard; and wherein the method comprises operating the climate control system to automatically control the booster fan in dependence on temperature measurements made by the temperature sensor of the UPS switchboard.

22. A method according to claim 14, wherein the services area accommodates a plurality of electrical switchboards in the cold zone of the services area; and wherein the method comprises cooling the plurality of electrical switchboards with cooling air supplied to the cold zone of the services area from the air handling unit.

23. A method according to claim 14, wherein the services area comprises a partition separating the cold zone from the hot zone, the partition forming a fire barrier and comprising an opening for allowing air to pass from the cold zone to the hot zone, the opening comprising a fire damper, wherein the services area additionally comprises an airflow path leading from an air outlet of the at least one UPS switchboard to the opening of the partition, wherein the cold zone is in direct fluid communication with the airflow path, and wherein the method comprises:
operating the data centre in a first fire free mode in which the fire damper is maintained in an open position thereby allowing warm air from the UPS switchboard to flow along the airflow path and through the opening into the hot zone;
switching data centre operation to a second fire detected mode; and, operating the data centre in the second fire detected mode in which the fire damper is maintained in a closed position thereby causing warm air from the UPS switchboard to flow into the cold zone;
wherein, the step of switching data centre operation comprises moving the fire damper from the open position to the closed position.

24. A method according to claim 23, wherein the airflow path leading from the air outlet of the at least one UPS switchboard to the opening of the partition is enclosed along at least part of its length, optionally wherein the airflow path is enclosed by a duct along at least part of its length.

25. A method according to claim 24, wherein the duct comprises an air inlet and an air outlet, wherein the air inlet is aligned with and spaced apart from the air outlet of the UPS switchboard thereby providing direct fluid communication between the cold zone and the airflow path, and wherein the air outlet is connected to the opening of the partition.

26. A method according to claim 23, wherein the cold zone of the services area comprises an air inlet for allowing cooling air to enter the cold zone, the air inlet having an adjustable vent and being comprised in a door of a door assembly for controlling personnel access to the cold zone, wherein the door assembly additionally comprises a fire door, wherein:
when the data centre is operated in the first fire free mode, the fire door is maintained in an open position thereby allowing the adjustable vent to regulate flow of cooling air into the cold zone; and
when then data centre is operated in the fire detected mode, the fire door is maintained in a closed position thereby preventing flow of cooling air into the cold zone;
wherein, the step of switching data centre operation comprises moving the fire door from the open position to the closed position.

27. A method according to claim 23, wherein the data centre comprises a fire control system comprising a controller and a plurality of fire detection sensors, the controller being configured to receive signals from the sensors and to transmit signals to the fire damper and the fire door, if present, wherein the method comprises operating the fire control system so that the controller automatically initiates the step of switching data centre operation from the first fire free mode to the second fire detected mode when a signal is received from at least one sensor.

* * * * *